United States Patent
Hwang

(10) Patent No.: US 10,153,863 B2
(45) Date of Patent: Dec. 11, 2018

(54) METHOD AND DEVICE FOR TRANSMITTING AND RECEIVING PACKET IN COMMUNICATION SYSTEM

(71) Applicant: Samsung Electronics Co., Ltd., Suwon-si, Gyeonggi-do (KR)

(72) Inventor: Sung-Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/111,322

(22) PCT Filed: Jan. 13, 2015

(86) PCT No.: PCT/KR2015/000358
§ 371 (c)(1),
(2) Date: Jul. 13, 2016

(87) PCT Pub. No.: WO2015/105404
PCT Pub. Date: Jul. 16, 2015

(65) Prior Publication Data
US 2016/0337076 A1    Nov. 17, 2016

(30) Foreign Application Priority Data

Jan. 13, 2014 (KR) .................. 10-2014-0004256
Jan. 13, 2014 (KR) .................. 10-2014-0004259
Jul. 4, 2014 (KR) .................. 10-2014-0083810

(51) Int. Cl.
*H04L 1/00* (2006.01)
*H03M 13/13* (2006.01)
(Continued)

(52) U.S. Cl.
CPC .......... *H04L 1/0041* (2013.01); *H03M 13/13* (2013.01); *H03M 13/2707* (2013.01);
(Continued)

(58) Field of Classification Search
CPC ...... H04L 1/0041; H04L 69/22; H04L 1/0045; H04L 1/0083; H04L 1/0075;
(Continued)

(56) References Cited

U.S. PATENT DOCUMENTS 7,617,436 B2 * 11/2009 Wenger ............... H04N 19/147
                                                                    714/758
7,660,245 B1 *  2/2010 Luby .................... H04L 1/0041
                                                                    370/230

(Continued)

FOREIGN PATENT DOCUMENTS

CN     101802797 A    8/2010
EP    3 065 326 A1    9/2016
(Continued)

OTHER PUBLICATIONS

K. Matsuzono, J. Detchart, M. Cunche, V. Roca and H. Asaeda, "Performance analysis of a high-performance real-time application with several AL-FEC schemes," IEEE Local Computer Network Conference, Denver, CO, 2010, pp. 1-7.*

(Continued)

*Primary Examiner* — Cynthia Britt
(74) *Attorney, Agent, or Firm* — Jefferson IP Law, LLP

(57) ABSTRACT

The present disclosure relates to a method and a device for transmitting and receiving a packet in a communication system. A method for transmitting a packet according to the present disclosure comprises the steps of: generating at least one source block including source packets for transmitting contents; performing forward error correction (FEC) encoding and generating at least one reconstructed block including reconstructed packets for restoring the source packets; and transmitting signaling information including packet identification information on the at least one source block and a packet stream including the source packets and the reconstructed packets, wherein header information of the recon- (Continued)

structed packets includes the number of source packets included in each source block according to the packet identification information, and information indicating the start numbers of the source packets included in the each source block.

12 Claims, 26 Drawing Sheets

(51) Int. Cl.
*H03M 13/27* (2006.01)
*H03M 13/00* (2006.01)
*H04L 29/06* (2006.01)

(52) U.S. Cl.
CPC ...... *H03M 13/6516* (2013.01); *H04L 1/0045* (2013.01); *H04L 1/0075* (2013.01); *H04L 1/0083* (2013.01); *H04L 69/22* (2013.01); *H04L 1/0057* (2013.01)

(58) Field of Classification Search
CPC . H04L 1/0057; H03M 13/2707; H03M 13/13; H03M 13/6516
See application file for complete search history.

(56) References Cited

U.S. PATENT DOCUMENTS

| | | | |
|---|---|---|---|
| 2005/0257106 A1* | 11/2005 | Luby | H03M 13/29 714/710 |
| 2006/0077890 A1* | 4/2006 | Suryavanshi | H03M 13/05 370/216 |
| 2007/0204196 A1 | 8/2007 | Watson et al. | |
| 2009/0067551 A1 | 3/2009 | Chen et al. | |
| 2010/0050057 A1* | 2/2010 | Luby | H04L 1/0041 714/776 |
| 2010/0231803 A1* | 9/2010 | Citta | H04N 21/234327 348/723 |
| 2013/0013982 A1 | 1/2013 | Hwang et al. | |
| 2013/0227376 A1 | 8/2013 | Hwang et al. | |
| 2013/0290814 A1 | 10/2013 | Hwang et al. | |
| 2013/0294447 A1 | 11/2013 | Myung et al. | |
| 2017/0063497 A1* | 3/2017 | Paniconi | H03M 13/353 |

FOREIGN PATENT DOCUMENTS

| | | |
|---|---|---|
| JP | 2009-52715 A | 3/2009 |
| JP | 2018-114598 A | 7/2018 |
| KR | 10-2010-0055528 A | 5/2010 |
| KR | 10-2013-0006380 A | 1/2013 |
| KR | 10-2013-0008438 A | 1/2013 |
| KR | 10-2013-0122552 A | 11/2013 |
| KR | 10-2013-0140938 A | 12/2013 |
| WO | 2013-165155 A1 | 11/2013 |

OTHER PUBLICATIONS

H. Jenka, T. Stockhammer and Wen Xu, "Permeable-layer receiver for reliable multicast transmission in wireless systems," IEEE Wireless Communications and Networking Conference, 2005, 2005, pp. 1805-1811 vol. 3.*
M. Luby, T. Stockhammer and M. Watson, "IPTV Systems, Standards and Architectures: Part II—Application Layer FEC in IPTV Services," in IEEE Communications Magazine, vol. 46, No. 5, pp. 94-101, May 2008.*
XP030059840, "On EEC signalingfor MMT", Oct. 31, 2013.
XP030020043, "Text of ISO/IEC 2nd CD 23008-1 MPEG Media Transport", Feb. 12, 2013.
XP030020266, "Text of ISO/IEC DIS 23008-1 MPEG Media Transport", May 10, 2013.
XP030062861, "EEC CE: In-band AL-FEC message", Jul. 5, 2014.
XP030061905, "Recontribution of M3256", Mar. 29, 2014.
XP030061015, "Repair FEC Payload ID for New FEC Signal & Framework", Jan. 14, 2014.

* cited by examiner

Repair Packet Blocks

| MMTP Header | MMTP Header | MMTP Header | MMTP Header | MMTP Header |
|---|---|---|---|---|
| Independent repair FEC payload ID | Dependent repair FEC payload ID | Independent repair FEC payload ID | Dependent repair FEC payload ID | Independent repair FEC payload ID |
| Repair Symbol | Repair Symbol | Repair Symbol | Repair Symbol | Repair Symbol |

FIG.18

Repair Packet Blocks

| MMTP Header | | MMTP Header | | MMTP Header |
|---|---|---|---|---|
| Independent repair FEC payload ID | MMTP Header | Independent repair FEC payload ID | MMTP Header | Independent repair FEC payload ID |
| Repair Symbol | Repair Symbol | Repair Symbol | Repair Symbol | Repair Symbol |

FIG.19

METHOD AND DEVICE FOR TRANSMITTING AND RECEIVING PACKET IN COMMUNICATION SYSTEM

CROSS-REFERENCE TO RELATED APPLICATION(S)

This application is a National Phase Entry of PCT International Application No. PCT/KR2015/000358, which was filed on Jan. 13, 2015, and claims a priority to Korean Patent Application No. 10-2014-0004256, which was filed on Jan. 13, 2014, and claims a priority to Korean Patent Application No. 10-2014-0004259, which was filed on Jan. 13, 2014, and claims a priority to Korean Patent Application No. 10-2014-0083810, which was filed on Jul. 4, 2014, the contents of which are incorporated herein by reference.

TECHNICAL FIELD

The present disclosure relates to packet transmitting/receiving methods and devices in communication systems.

BACKGROUND ART

As various contents are diversified, and high-volume contents, such as high-definition (HD) contents, ultra-high-definition (UHD) contents, proliferate, data congestion increases. Under such circumstance, contents transmitted from a sensor (e.g., a Host A) are not normally transferred to a receiver (e.g., a Host B), and some of the contents are lost on the route.

Generally, since data is transmitted in packet units, content loss occurs in packet units. A packet includes one block of transmitted data (e.g., payload), address information (e.g., the sender's address and destination address) and management information (e.g., header). Accordingly, in case packet loss occurs over the network, the receiver cannot receive lost packets and cannot be thus aware of data and management information in the lost packets. This causes user inconvenience in various types, such as degraded audio quality, deterioration of video quality or image distortion, subtitle missing, or file loss. Thus, in order to restore data loss caused on a network, application layer forward error correction (AL-FEC) and method for configuring and transmitting/receiving FEC packets for the same are needed.

DISCLOSURE

Technical Problem

MPEG Output Document W13982 (ISO/IEC 23008-1 MPEP Media Transport (MMT)) Final Draft International Specification Annex C defines AL-FEC Framework for MMT. Repair packets are generated using an FEC code for source packets for FEC protection are generated, and the source packets are FEC-protected and added with source FEC payload identifiers (IDs) to generate FEC source packets, which are transmitted along with the repair packets. The AL-FEC message containing the FEC-related configuration information is previously or periodically transmitted before the FEC source packets and repair packets are transmitted, allowing the receiving terminal to be aware of the FEC-related configuration information.

The source packets are transmitted, added with the source FEC payload IDs. Thus, in order to generate other repair packets for the same source packets, other source FEC payload IDs need to be added. Thus, generating several repair packets having different FEC configurations for one source packet is limited or becomes inefficient.

Further, in case the transmitter sends only source packets without FEC protection, and an intermediate node in the network performs FEC protection, such problem arises that the network node is required to add source FEC payload IDs to the source packets transmitted by the transmitter. Thus, a need exists for a method for performing FEC protection without adding source FEC payload IDs to source packets.

Thus, according to the present disclosure, there are provided a method and device for efficiently transmitting and receiving packets in a communication system using FEC.

Further, according to the present disclosure, there are provided a method and device for transmitting and receiving packets without adding source FEC payload IDs to source packets using repair FEC payload IDs transmitted in AL-FEC messages and repair packets in a communication system using FEC.

Technical Solution

According to an embodiment of the present disclosure, a method for transmitting a packet in a communication system comprises the steps of generating at least one source block including source packets for transmission of a content, generating at least one repair block including repair packets to restore the source packets by performing forward error correction (FEC) encoding, and transmitting a packet stream including the repair packets and the source packets and signaling information including packet identification information for the at least one source block, wherein header information of the repair packets includes information indicating the number of source packets included in each source block per packet identification information and a start number of the source packets included in each source block.

According to an embodiment of the present disclosure, a device transmitting a packet in a communication system comprises a transmitting unit transmitting the packet, an encoding unit performing forward error correction (FEC) encoding, and a controller controlling the operations of generating at least one source block including source packets for transmission of a content, generating at least one repair block including repair packets to restore the source packets by performing forward error correction (FEC) encoding, and transmitting a packet stream including the repair packets and the source packets and signaling information including packet identification information for the at least one source block, wherein header information of the repair packets includes information indicating the number of source packets included in each source block per packet identification information and a start number of the source packets included in each source block.

According to an embodiment of the present disclosure, a method for transmitting a packet in a communication system includes a transmitting unit including the process of generating MMT packets for a signaling message (including an AL-FEC message) and Assets to be transmitted, the process of generating a repair symbol block by performing FEC encoding on an FEC configuration, such as an FEC coding structure, an SSBG mode, and an FEC code, defined in an AL-FEC message for the MMT packets, i.e., source packets, corresponding to Assets to be FEC protected among the Assets, and the process of adding an FEC repair payload ID proposed herein to the repair symbol(s) to generate an FEC repair packet, and the process of transmitting the MMT packet, and FEC repair packet, along with the signaling message including the AL-FEC message, in an MMT packet stream.

According to an embodiment of the present disclosure, higher-quality services may be offered to the user.

According to an embodiment of the present disclosure, the receiving device may differentiate each data stream from separate control information different from the source packet or stream differentiating information in the FEC packet, grasp the repair stream generated for FEC protection on each data stream, smoothly perform FEC decoding, and generate a repair flow for a predetermined number of data streams included in the generated source packet flow without influencing the source packet.

BRIEF DESCRIPTION OF THE DRAWINGS

FIGS. 18 and 19 are views illustrating an FEC source or repair packet block including an independent repair FEC payload ID and dependent repair FEC payload ID according to another embodiment of the present disclosure.

MODE FOR CARRYING OUT THE INVENTION

Figure 1A:
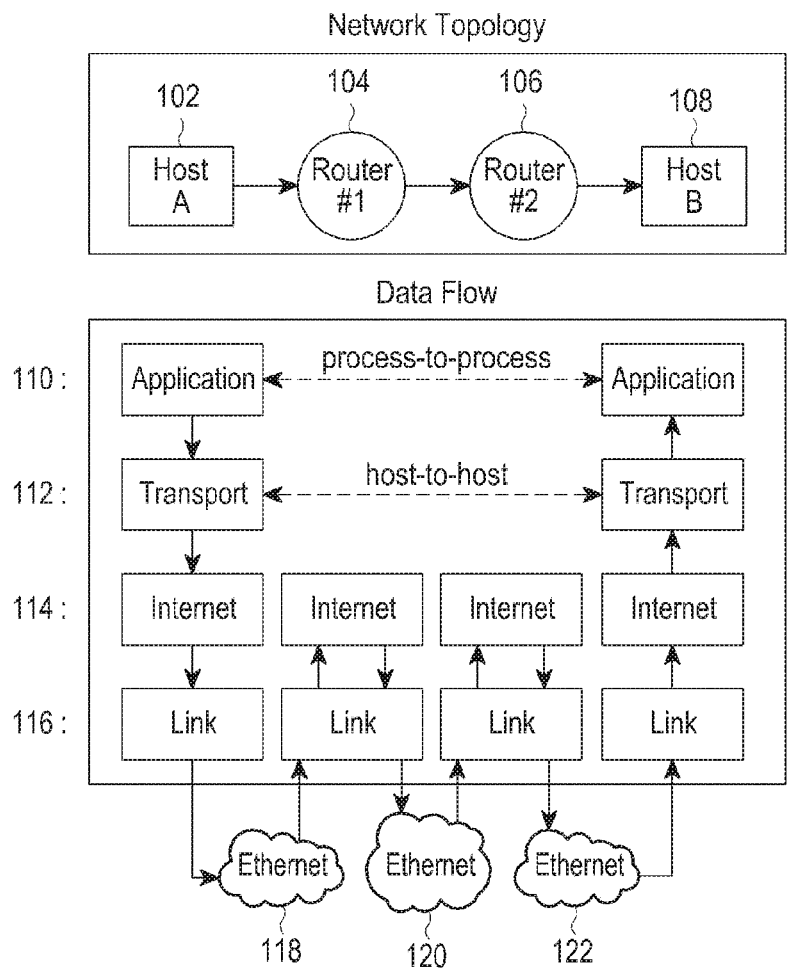
FIGS. 1a and 1b are views illustrating a network topology and data flow.

When determined to make the subject matter of the present disclosure unclear, the detailed of the known functions or configurations may be skipped. The terms as used herein are defined considering the functions in the present disclosure and may be replaced with other terms according to the intention or practice of the user or operator. Therefore, the terms should be defined based on the overall disclosure.

First, the terms used herein are summarized in Tables 1 to 3 below.

TABLE 1

| Term | Description |
| --- | --- |
| access unit | smallest media data entity to which timing information can be attributed |
| asset | any multimedia data entity that is associated with a unique identifier and that is used for building a multimedia presentation |
| code rate | ratio between the number of source symbols and the number of encoding symbols |
| encoding symbol | unit of data generated by the encoding process |
| encoding symbol block | set of encoding symbols |
| FEC code | algorithm for encoding data such that the encoded data flow is resilient to data loss |
| FEC encoded flow | logical set of flows that consists of an FEC source flow and one or more associated FEC repair flows |
| FEC payload ID | identifier that identifies the contents of a MMT packet with respect to the MMT FEC scheme |

TABLE 1-continued

| Term | Description |
| --- | --- |
| FEC repair flow | data flow carrying repair symbols to protect an FEC source flow |
| FEC repair packet | MMT packet along with repair FEC payload identifier to deliver one or more repair symbols of a repair symbol block |
| FEC source flow | flow of MMT packets protected by an MMT FEC scheme |
| FEC source packet | MMT packet along with source FEC payload identifier |

TABLE 2

| Term | Description |
| --- | --- |
| media fragment unit | fragment of a media processing unit |
| media processing unit | generic container for independently decodable timed or non-timed data that is media codec agnostic |
| MMT entity | software and/or hardware implementation that is compliant to a profile of MMT |
| MMT FEC scheme | forward error correction procedure that defines the additional protocol aspects required to use an FEC scheme in MMT |
| MMT packet | formatted unit of the media data to be delivered using the MMT protocol. |
| MMT payload | formatted unit of media data to carry MMT packages and/or signaling messages using either the MMT protocol or an Internet application layer transport protocols (e.g. RTP) |
| MMT protocol | application layer transport protocol for delivering MMT payload over IP networks |
| MMT receiving entity | MMT entity that receives and consumes media data |
| MMT sending entity | MMT entity that sends media data to one or more MMT receiving entities |

TABLE 3

| Term | Description |
| --- | --- |
| non-timed data | media data that do not have inherent timeline for the decoding and/or presentating of its media content |
| package | logical collection of media data, delivered using MMT |
| repair FEC payload ID | FEC payload ID for repair packets |
| repair symbol | encoding symbol that contains redundancy information for error correction |
| repair symbol block | set of repair symbols which can be used to recover lost source symbols |
| source FEC payload ID | FEC payload ID for source packets. |
| source packet block | segmented set of FEC source flow that is to be protected as a single block |
| source symbol | unit of data to be encoded by an FEC encoding |
| source symbol block | process set of source symbols generated from a single source packet block |
| timed data | any data that has inherent timeline information for the decoding and/or presentation of its media contents. |

In an embodiment of the present disclosure, the header of the source packet or FEC repair packet includes information for differentiating the source packet or FEC repair packet. In case a packet transmission method adding a separate source symbol ID (SS_ID) for letting the order of source symbols in the source symbol block known to the source packet and packet transmission method according to the present disclosure are used together, the header of the FEC repair packet or source packet according to the present disclosure includes at least one of information indicating whether the packet is source packet+SD_ID or indicating the source packet itself and information differentiating the FEC repair packets according to the present disclosure.

The following Table 4 represents an embodiment of the FEC type of MMT packet header and represents the value of FEC_type (or MMT packet type).

TABLE 4

| Value | Description |
| --- | --- |
| 0 | MMT packet without FEC Source Payload ID |
| 1 | MMT packet with FEC Source Payload ID |
| 2 | MMT packet for repair symbol(s) for FEC Payload Mode 0 (FEC repair packet) |
| 3 | MMT packet for repair symbol(s) for FEC Payload Mode 1 (FEC repair packet) |

NOTE,
If FEC type is set to 0, it indicates that FEC is not applied to this MMT packet or that FEC is applied to this MMT packet without adding FEC Source Payload ID. In the latter case, the combination of packet_sequence_number and packet_id in this packet identify the location of this MMT packet within Source Packet Block which is identified by the FEC repair payload ID of its associated FEC repair packet (e.g. replacement of SS_ID).

Further, such information for differentiating packets has the Payload ID_Mode Flag indicating whether FEC applies and packets are transmitted in the legacy method through the AL_FEC message or FEC applies and transmission is performed according to the present disclosure and it is transmitted to the receiving terminal.

Payload ID_Mode Flag=1, packet transmission method applying FEC according to the present disclosure (that is, the information in the source packet replaces SS_ID without using a separate SS_ID in the source packet and follows the FEC repair packet format (e.g., FEC Repair Payload ID) according to the present disclosure).

Payload ID_Mode Flag=0, packet transmission method applying FEC as in the conventional invention (that is, the source packet adds a separate SS_ID and follows the FEC repair packet format (e.g., repair FEC Payload ID) according to the conventional invention.)

Hereinafter, parity and repair are interchangeably used in the same meaning.

First, the basic concept of an embodiment of the present disclosure is described.

An Embodiment

A method for transmitting packets in a communication system according to an embodiment of the present disclosure is described. The transmitter generates MMT packets for a signaling message (including e.g., AL-FEC message) and Assets for transmission. The transmitter performs FEC encoding on FEC configurations such as FEC coding structure, SSBG mode, and FEC code, defined in the AL-FEC message for the MMT packets, i.e., source packets, corresponding to the Assets for FEC protection among the Assets, thereby generating a repair symbol block. The transmitter adds the FEC repair payload ID according to the present disclosure to the repair symbol(s) to generate the FEC repair packet. The transmitter transmits the MMT packet and FEC repair packet, along with the Signaling message including the AL-FEC message, in a MMT packet stream. The AL-FEC message may also be transmitted before transmitting the MMT packet or FEC repair packet.

Here, the repair FEC payload ID proposed herein includes at least one of, e.g., M, T, SSM, timestamp, SS_start_seq_nr [0]~[N−1], L[0]~[N−1], SSB_length [0]~[N−1], L2,RSB_length, and L3,RS_ID. The FEC repair payload ID may be included in the header of the FEC repair packet.

Hereinafter, each information that may be included in the FEC repair payload ID is described in detail.

"M" indicates whether the repair FEC payload ID of the repair packet is a dependent repair FEC payload ID or independent repair FEC payload ID (information necessary for FEC decoding processing may be obtained with a combination of Dependent repair FEC payload ID definition, i in the repair FEC payload ID, and information stored in the AL-FEC message). The Independent repair FEC payload ID indicates that information necessary for FEC decoding processing may be obtained with only the information of the packet including the Independent repair FEC payload ID without the information stored in the AL-FEC message. In case only Dependent repair FEC Payload ID is used but the Independent repair FEC Payload ID is not, the M field remains Reserved Field. The following information denotes the meaning of each Field in the case being used as Dependent repair FEC Payload ID.

"T" is flag information indicating whether there is timestamp field.

"SSM" is information indicating the size of SS_start_seq_nr field (e.g., size of SS_start_seq_nr field (in bits)=8+8*SSM).

"timestamp" denotes the timestamp stored in the first source packet of the source packet block protected by the repair packet.

"SS_start_seq_nr[i]" denotes the LSB value as large a size as 8+8*SSM bits in the lowest packet sequence number among source packets of the source packet (or symbol) block having the ith packet_ID value in the source flow described in the AL-FEC message (e.g., if packet_sequence_number is 32 bits, and 8+8*SSM is 24 bits, the remaining 24 bits value except for the first 8 bits in the packet_sequence_number. Accordingly, it may be known which packet has the lowest source packet (i.e., the first or start source packet) among the source packets having the same packet ID (i.e., having the ith packet ID) in the source packet (or symbol) block through the "SS_start_seq_nr[i]". In another embodiment, although the lowest sequence number is not used, other information allowing it to be known which packet is the first or start source packet in the source packet (or symbol) block may also be available. The packets belonging to different Assets may be distinguished using the packet ID. For example, if the source packet of Asset a is a packet for transmitting video data, and the source packet of Asset b is a packet for transferring audio data, the packet ID of the Asset a packet and the packet ID of the Asset b packet differ from each other.

"L[i]" is information indicating the size of SSB_length[i] field and is given as SSB_length field size=6+8*L.

"SSB_length[i]" denotes the number (i=0, 1, . . . , N−1) of source packets (or symbols) in the source packet (or symbol) block. The number of source packets (or symbols) may be understood as the number of source packets having the same packet ID (i.e., having the ith packet ID) in the source packet (or symbol) block.

"L2" is information indicating the size of RSB_length field and is given as, e.g., RSB_length field size=6+8*L2.

Figure 11A:
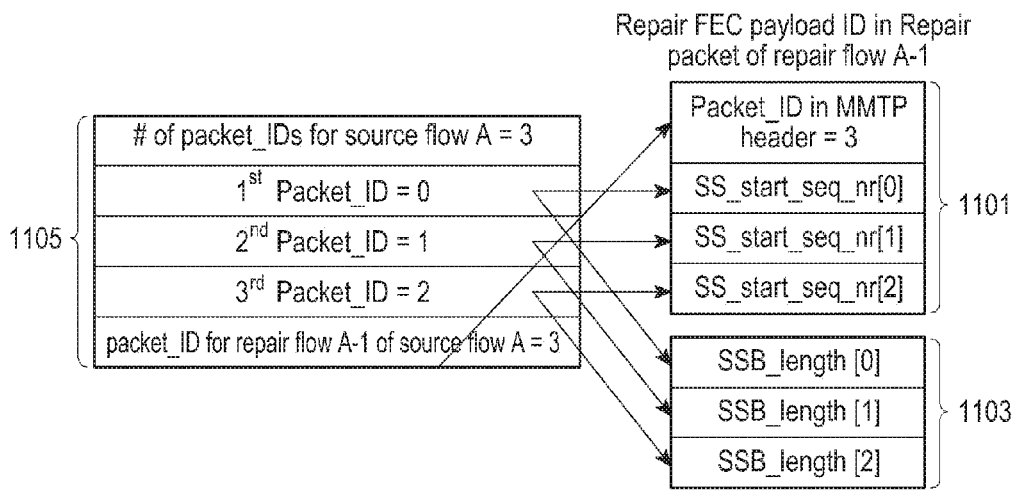
FIG. 11a is a view illustrating a relation between an AL-FEC message and repair FEC payload ID of a repair packet according to an embodiment of the present disclosure.
Figure 11B:
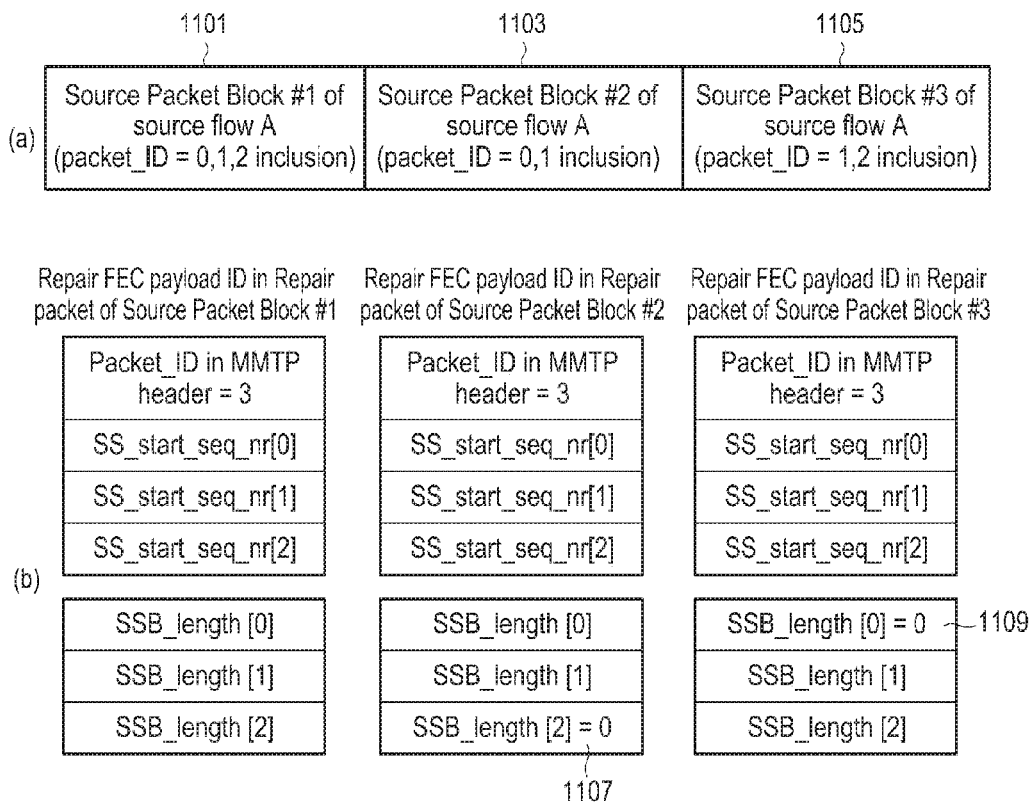
FIG. 11b is a view illustrating a method for setting fields of a repair FEC payload of a repair packet for a packet_ID included in a source flow but excluded from some source packet block according to an embodiment of the present disclosure.

That is, as exemplified in FIG. 11a, information of SSB_length fields 1103 and the SS_start_seq_nr field's 1101 included in the repair FEC payload ID of the repair packet denotes the start sequence number and the number of source packets corresponding to the Packet_ID's 1105 included in the Source Flow described in the AL-FEC message. Even in case the number of Packet_ID's included in the Source Flow is smaller than the number of Packet_ID's included in the source packet (or symbol) block, as shown in FIG. 11b, the repair FEC payload ID of the repair packet for the source packet (or symbol) block has SS_start_seq_nr_field's and SSB_length field's as many as the number of Packet_ID's included in the Source flow described in the AL-FEC message which have the same order. However, a particular value is set as SS_start_seq_nr field or SSB_length field corresponding to the order of Packet_IDs not included in the source packet (or symbol) block, thereby indicating that the related source packet (or symbol) block does not include the Packet_ID. As an example, the SSB_length field value may be set to 0 to indicate that the packet having the Packet_ID is not included in the source packet (or symbol) block.

Specifically, referring to FIG. 11b(a), in case whereas the source flow described in the AL-FEC message consists of three Packet_ID's (0, 1, 2), source packet (or symbol) Block #1 consists of 0, 1, and 2 (1101), source packet (or symbol) block #2 of 0 and 1 (1103), and source packet (or symbol) block #3 of 1 and 2 (1105), as shown in FIG. 11b(b), the repair FEC payload ID of the repair packet for the source flow includes three SS_start_seq_nr's and three SSB_length fields as in the order of the Packet_ID's 0, 1, and 2, but in its field value, the repair FEC payload ID of the repair packet for source packet (or symbol) block 1 sets SS_start_seq_nr and SSB_length for packet_ID 0, 1, and 2, the repair FEC payload ID of the repair packet for source packet (or symbol) block 2 sets SS_start_seq_nr and SSB_length for the packet_ID 0 and 1, and does not include packet_ID 2, and thus, sets 0 (1107, 1109) in SSB_length Field to indicate that the source packet (or symbol) block 2 does not include packet_ID 2. Since the source packet (or symbol) block 3 does not include Packet_ID 0, the repair FEC payload ID of the repair packet for source packet (or symbol) block 3 sets 0 to the SSB_length Field and SS_start_seq_nr and SSB_length for Packet_ID's 1 and 2. Further, in the SSB_length field corresponding to the Packet_ID not included in the source packet (or symbol) block, the L field to determine the size is set to 0, minimizing the size of SSB_length field.

"RSB_length" is information on the number of repair symbols of the repair symbol block included in the repair packet.

"L3" is information indicating the size of RS_ID field and is given as, e.g., RS_ID field size=6+8*L2.

"RS_ID" denotes the position of the repair symbol(s) in the repair packet in the repair symbol block including the repair packet (e.g., it denotes what number of repair symbol it is).

According to an embodiment of the present disclosure, the transmitting device may include a transmitting unit, an encoding unit performing FEC encoding, and a controller controlling the operations of generating MMT packets for a signaling message (including AL-FEC message) and Assets to be transmitted, generating a repair symbol block by performing FEC encoding, through the encoding unit, on the FEC configurations, such as FEC coding structure, SSBG mode, and FEC code, defined in the AL-FEC message for the MMT packets, i.e., source packets corresponding to the Assets to be FEC protected among the Assets and adding an FEC repair payload ID proposed herein to generate FEC repair packets and transmitting the same, along with the signaling message including the AL-FEC message, in an MMT packet stream through the transmitting unit.

Here, the repair FEC payload ID proposed herein includes at least one of the M, T, SSM, timestamp, SS_start_seq_nr [0]~[N−1], L[0]~[N−1], SSB_length [0]~[N−1], L2,RSB_length, and L3,RS_ID.

Another transmission method according to an embodiment of the present disclosure is described. In generating and transmitting the MMT packets for the Signaling message and Assets to be transmitted, an intermediate node in the network (e.g., Contribution Network) determines the Asset(s) and FEC configuration for FEC protection. The intermediate Node generates the AL-FEC message including the Packet_ID list mapped to the Asset(s) based on the Asset(s) for FEC protection and FEC configuration information and repair flow ID mapped thereto and creates them into MMT packet. The intermediate Node generates the repair symbol for FEC protection on the MMT packets corresponding to the Asset(s) to generate the repair packets including the dependent repair FEC payload ID according to the present disclosure and transmits them. The network intermediate Node may transmit the generated AL-FEC message before transmitting the source packet block.

Here, the repair FEC payload ID proposed herein includes at least one of the M, T, SSM, timestamp, SS_start_seq_nr [0]~[N−1], L[0]~[N−1], SSB_length [0]~[N−1], L2,RSB_length, and L3,RS_ID. According to an embodiment of the present disclosure, another transmitting device is included in the intermediate Node of the network (e.g., Configuration Network). The transmitting device of the intermediate Node includes a transmitting unit, an encoding unit performing FEC encoding, and a controller controlling the operations of determining the FEC configuration information and Asset(s) for FEC protection in generating and transmitting MMT packets for a signaling message and Assets to be transmitted, generating the AL-FEC message including the Packet_ID list mapped to the Asset(s) based on the Asset(s) for FEC protection and FEC configuration information and repair flow ID mapped thereto and creating them into MMT packet, performing FEC encoding through the encoding unit for FEC protection of the MMT packets corresponding to the Asset(s) to generate repair symbols to generate the repair packets including the dependent repair FEC payload ID according to the present disclosure. Further, the controller controls the operation of transmitting the MMT packets including the repair packet and the generated AL-FEC message through the transmitting unit. Here, the repair FEC payload ID proposed herein includes at least one of the M, T, SSM, timestamp, SS_start_seq_nr[0]~[N−1], L[0] [N−1], SSB_length [0]~[N−1], L2,RSB_length, and L3,RS_ID. A receiving method according to an embodiment of the present disclosure is described. The transmitter receives the packet including the AL-FEC message from the transmitter to obtain the AL-FEC message. The receiver obtains the packet ID list which is ID information for data streams included in the FEC source packet flow and the mapping information on the repair flow ID protecting the packet ID list from the AL-FEC message. The receiver determines whether the packet received from the transmitter is source packet or FEC repair packet. In case the received packet is the FEC repair packet, the receiver obtains repair symbol from the FEC repair packet and obtains the Packet_ID lists of the source packets FEC protected by the Packet_ID of the FEC repair packet (i.e., repair flow ID) from the received AL-FEC message information. The receiver differentiates the source packets included in the source packet block protected by the FEC repair packet from the SS_start_seq_nr list of the repair FEC payload ID of the FEC repair packet and the Packet_ID list of the obtained source packets, configures an encoding symbol block from the repair symbols and the source packets differentiated from each other, and performs FEC decoding on the configured encoding symbol block to restore the source symbol, and obtains the source packets of the packet block lost during transmission from the restored source symbol.

According to an embodiment of the present disclosure, a receiving device may include a receiving unit, a decoding unit performing FEC decoding, and a controller controlling the operations of receiving the packet including the AL-FEC message from the transmitter through the receiving unit to obtain the AL-FEC message, obtaining the packet ID list which is ID information for data streams included in the FEC source packet flow and mapping information on the repair flow ID protecting the same from the AL-FEC message, differentiating whether the packet received from the transmitter is the source packet or FEC repair packet, obtaining the repair symbol from the FEC repair packet, recognizing, from the obtained AL-FEC message information, the Packet_ID lists of the source packets FEC protected by the Packet_ID of the FEC repair packet (i.e., repair flow ID) to differentiate the source packets included in the source packet block protected by the FEC repair packet from the SS_start_seq_nr list of the repair FEC payload ID of the FEC repair packet and the Packet_ID list of the source packets, configuring an encoding symbol block from the differentiated source packets and repair symbols, FEC-decoding the configured encoding symbol block through the decoding unit to restore the source symbol, and obtaining the source packet of the source packet block lost during the transmission from the restored source sb.

Hereinafter, embodiments of the present disclosure are described in detail with reference to the accompanying drawings.

Figure 1B:
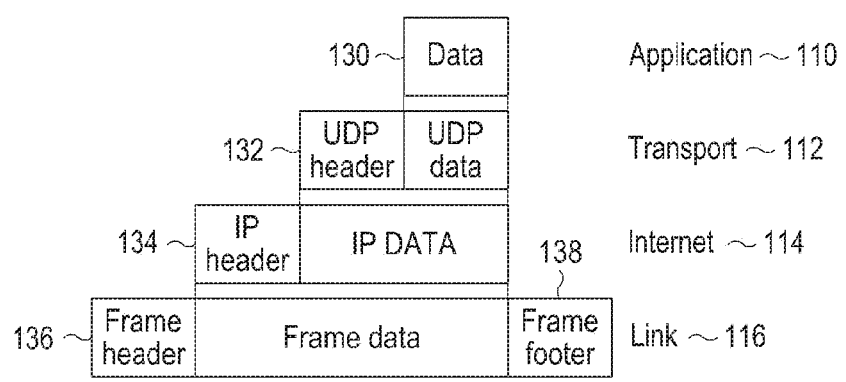

FIGS. 1a and 1b are views illustrating a network topology and data flow.

Referring to FIG. 1a, the network topology includes a host A 102 operating as a transmitter and a host B 108 operating as a receiver, and the host A 102 and the host B 108 are connected through one or more routers 104 and 106. The host A 102 and the host B 108 are connected with the routers 104 and 106 through Ethernet 118 and 122, and the routers 104 and 106 may be connected with each other via an optic fiber, satellite communication or other possible means 120. The data flow between the host A 102 and the host B 108 is performed through a link layer 116, Internet layer 114, transport layer 112, and application layer 110.

Referring to FIG. 1b, the application layer 130 generates data 130 to be transmitted through the AL-FEC. The data 130 may be the MMT packet data as per MMT or RTP packet data obtained by splitting the compressed data at the audio/video (AV) codec end using the real time protocol (RTP). The data 130 is converted into, e.g., a UDP packet 132 having a user datagram protocol (UDP) header inserted therein, by the transport layer 112. The Internet layer 114 generates the IP packet 134 by adding the IP header to the UDP packet 132, and the link layer 116 adds the frame header 136, and if necessary, frame footer, to the IP packet 134 to configure a frame 116 to be transmitted.

Figure 2:
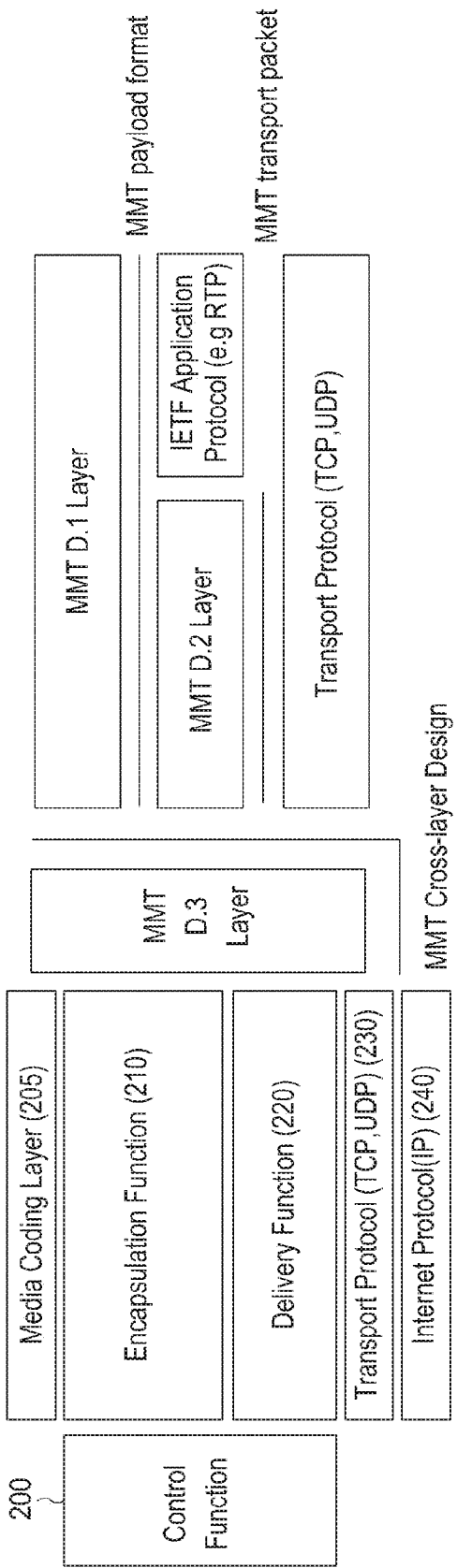
FIG. 2 is a view illustrating a configuration of a MMT system according to an embodiment of the present disclosure.

FIG. 2 is a view illustrating a configuration of a (MPEG Media Transport) MMT system according to an embodiment of the present disclosure.

The left side of FIG. 2 shows the configuration of the MMT system, and the right side shows the detailed structure of the delivery function.

The media coding layer 205 compresses the audio and/or video data and transmits to the encapsulation function layer 210 (E. Layer).

The encapsulation function layer 210 packages the compressed audio/video data into a format similar to the file format and transfers to the delivery function layer 220.

The delivery function layer 220 (or "D. Layer") formats the output of the encapsulation function layer 210 into an MMT payload and adds the MMT transmission packet header thereto and transfers to the transport protocol layer 230 in the MMT transmission packet form. Or, the delivery function layer 220 transfers the output of the encapsulation function layer 210 to the transport protocol layer 230 in the RTP packet form using the legacy RTP protocol. Thereafter, the transport protocol layer 230 converts into any one protocol of the user datagram protocol (UDP) and transmission control protocol (TCP) and transmits to the IP layer 240. Finally, the IP layer 240 converts the output from the transport protocol layer 230 into an IP packet and transmits it using the IP protocol.

The present disclosure may protect MMTP packets, MMT payload, or payload data.

The control function layer 220 (C. Layer) manages the presentation session and delivery session.

Figure 3:
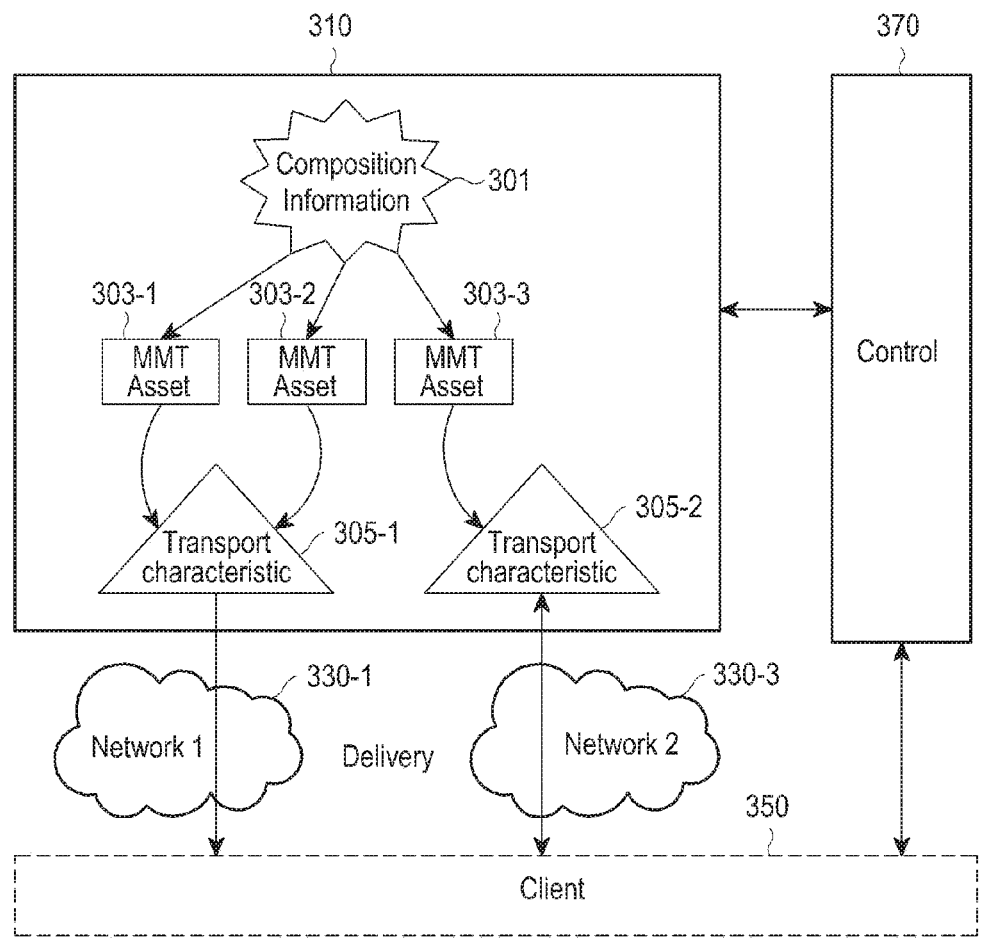
FIG. 3 is a view illustrating a structure of a MMT package according to an embodiment of the present disclosure.

FIG. 3 is a view illustrating the structure of a MMT package.

As shown in FIG. 3, the MMT package 310 is transmitted/received with the client 350 through the delivery function layer (D. Layer) 330-1 or 330-2 of the network and includes MMT Assets 303-1 to 303-3, composition information 301, and transport characteristics 305-1 and 305-2.

The MMT package 310 has functionality and operations for utilizing configuration information. The configuration information includes MMT Assets 303-1 to 303-2 list, composition information 301, and transport characteristics 305-1 and 305-2.

The description information describes the MMT package 310 and the MMT Assets 303-1 to 303-3. The composition information assists in consuming the MMT Assets 303-1 to 303-3. The transport characteristics 305-1 and 305-2 provide a hint for transfer of the MMT Assets 303-1 to 303-3.

The MMT package 310 describes the transport characteristic per MMT Asset. The transport characteristics 305-1 and 305-2 include error resiliency information, and simple transport characteristic information for one MMT Asset may be lost or not. Further, the transport characteristics 305-1 and 305-2 may include quality of service (QoS), degree of acceptable loss, and degree of acceptable delay of each MMT Asset.

Figure 4:
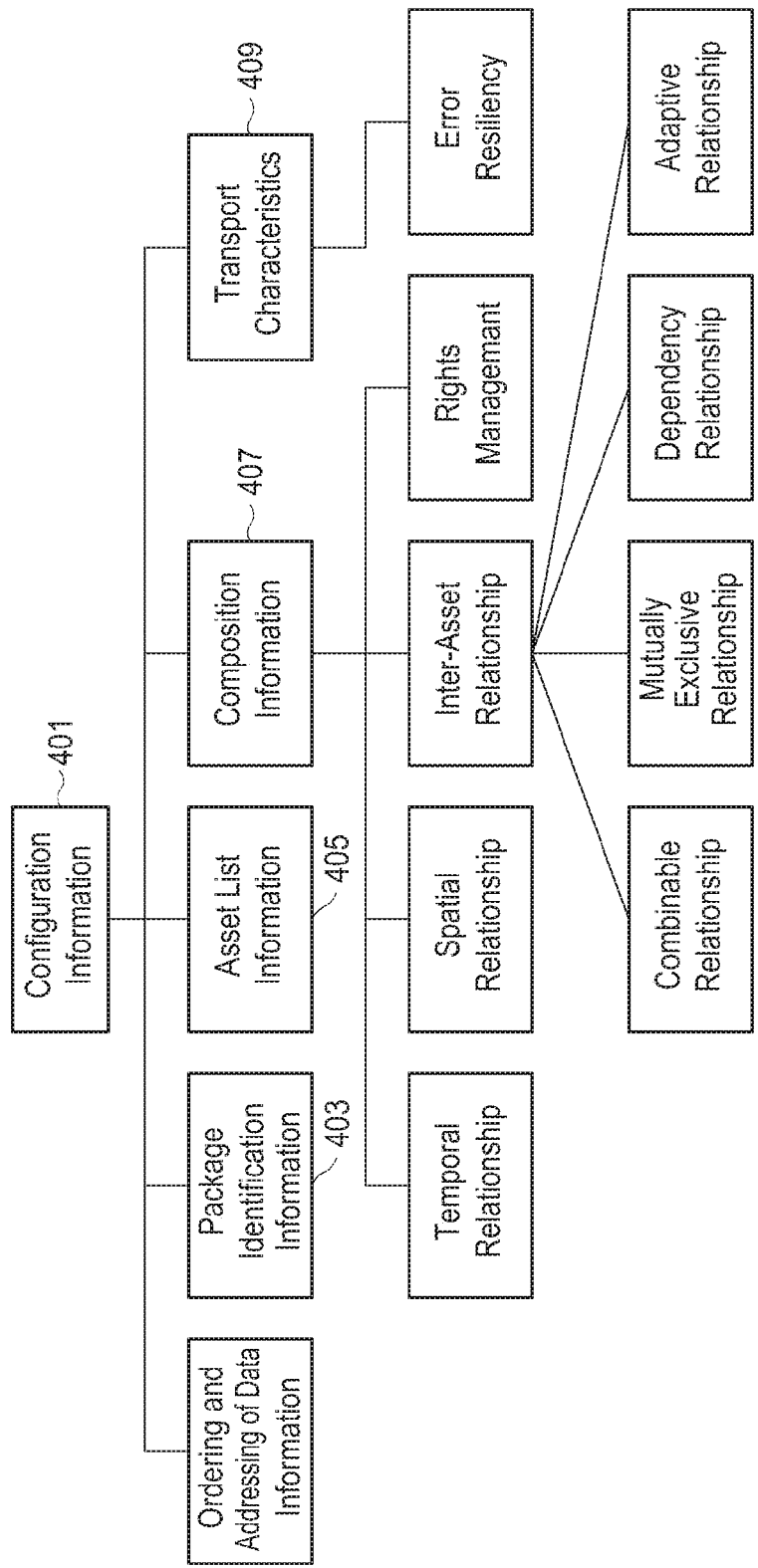
FIG. 4 is a view illustrating a configuration of configuration information included in a MMT package according to an embodiment of the present disclosure.

FIG. 4 is a view illustrating a configuration of configuration information included in a MMT package and its lower-level information according to an embodiment of the present disclosure.

Referring to FIG. 4, the configuration information 401 includes the identification information 403 on the package, information 405 on the list of Assets which are components of the package, composition information 407, transport characteristics 409, contents, and additional information, and provide structural information, such as how and where in the package such components are included. The known MMT standards may be referenced for the detailed description of the configuration information included in the MMT package, and its detailed description is omitted.

Figure 5A:
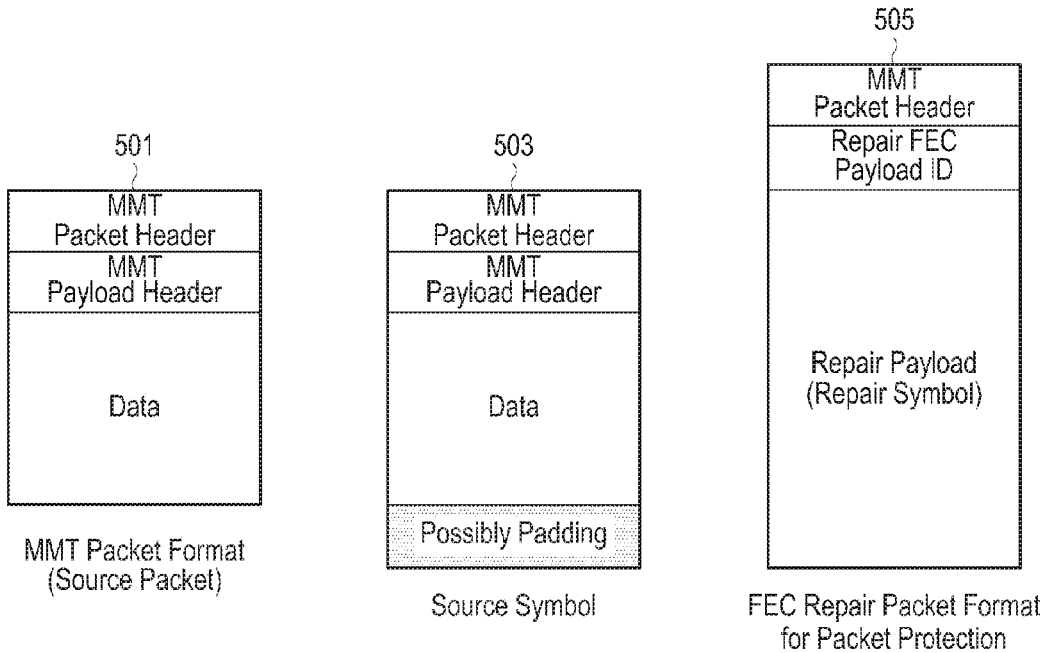
FIG. 5a is a view illustrating a source packet, source symbol, and FEC repair packet format according to an embodiment of the present disclosure.

FIG. 5a is a view illustrating a source packet, source symbol, and FEC repair packet according to an embodiment of the present disclosure.

Referring to FIG. 5a, Source Packet (=MMTP Packet) 501 includes MMT Packet Header, MMT Payload Header, and Payload (Data). Source Symbol 503 is generated by adding Possibly Padding to Source Packet, and the Possibly Padding may be give through AL-FEC Message, as large Padding data (all 00h) as the difference from a predefined size of repair symbol may be added. FEC Repair Packet 505 consists of repair symbols generated from the source symbol block by MMT Packet Header, repair FEC Payload ID, and FEC encoding.

Figure 5B:
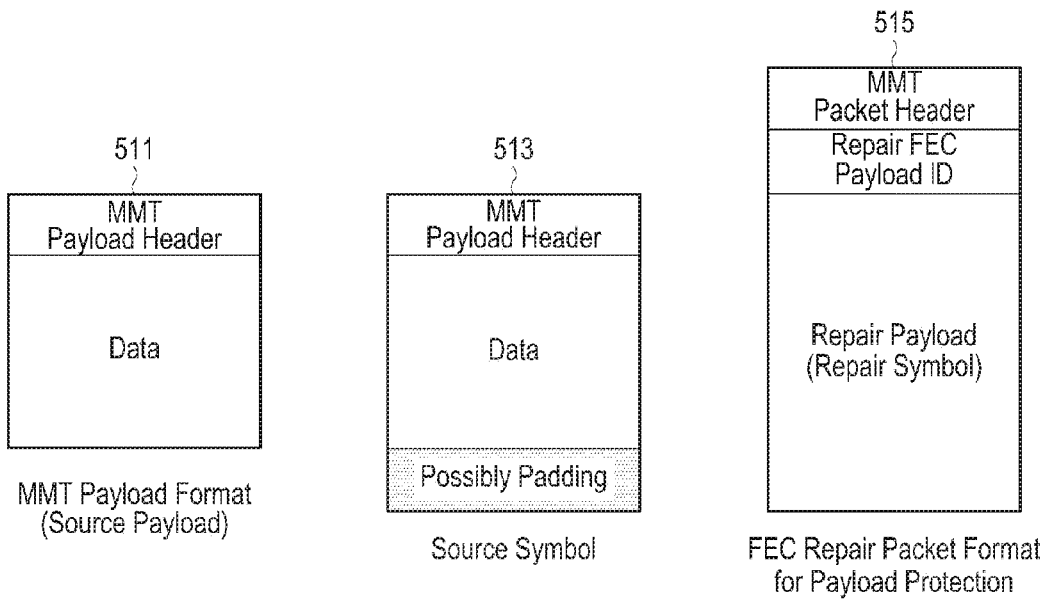
FIGS. 5b and 5c are views illustrating the configuration of a source payload, source symbol, and FEC repair packet format according to an embodiment of the present disclosure.

FIG. 5b is a view illustrating a source payload, source symbol, and FEC repair packet according to an embodiment of the present disclosure.

Referring to FIG. 5b, Source Payload (=MMT Payload) 511 includes MMT Payload Header and Payload (Data). Source Symbol 513 is generated by adding Possibly Padding to Source Payload 511, and the Possibly Padding may be give through AL-FEC Message, as large Padding data (all 00h) as the difference from a predefined size of repair symbol may be added. FEC Repair Packet 515 includes repair symbols generated from the source symbol block by MMT Packet Header, FEC repair payload ID, and FEC encoding.

Figure 5C:
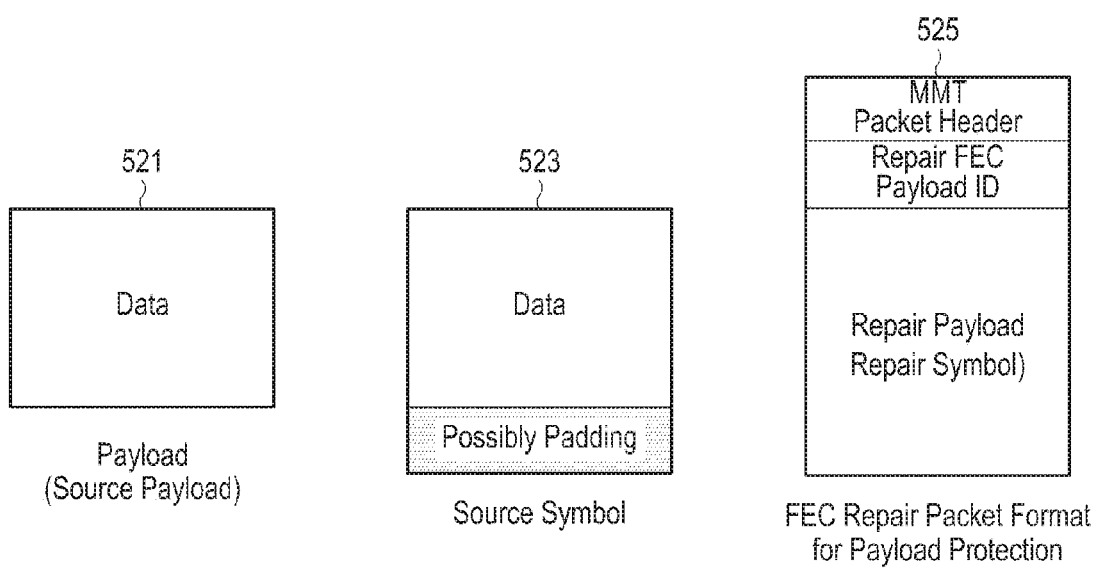

FIG. 5c is a view illustrating a source payload, source symbol, and FEC repair packet according to an embodiment of the present disclosure.

Referring to FIG. 5c, Source Payload (=MMT Payload) 521 includes Payload (Data). Source Symbol 523 is generated by adding Possibly Padding to Source Payload 521, and the Possibly Padding may be give through AL-FEC Message, as large Padding data (all 00h) as the difference from a predefined size of repair symbol may be added. FEC Repair Packet 525 includes repair symbols generated from the source symbol block by MMT Packet Header, FEC repair payload ID, and FEC encoding. The Repair FEC Payload ID is given as shown in FIG. 10.

Figure 10:
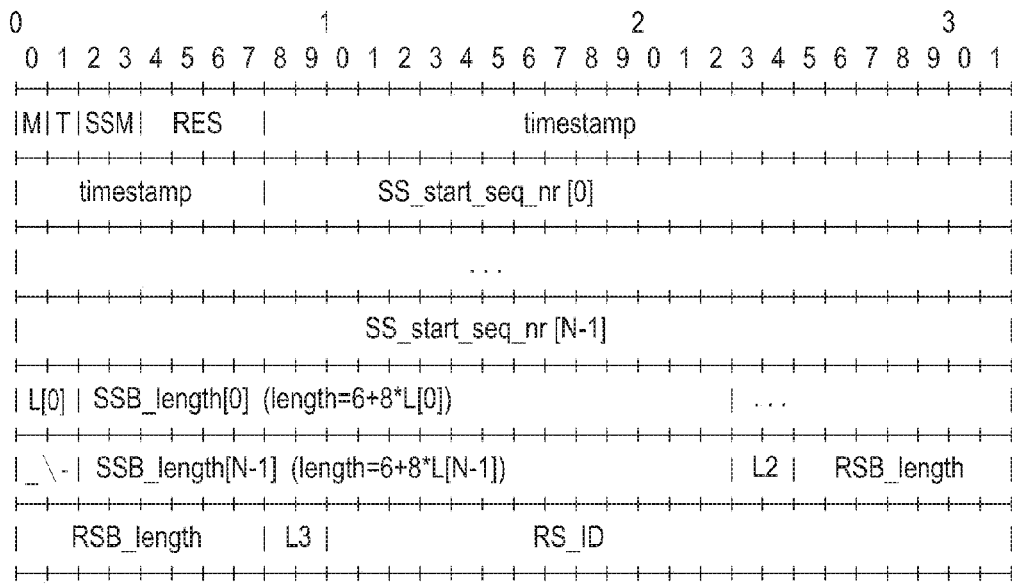
FIG. 10 is a view illustrating a dependent repair FEC payload ID according to an embodiment of the present disclosure.

FIG. 10 is a view illustrating the dependent repair FEC payload ID according to an embodiment of the present disclosure, and the details of each information shown in FIG. 10 is shown in Table 5 below.

TABLE 5

| Information | Detail |
| --- | --- |
| M (1 bit) | indicates whether this repair packet carries dependent repair FEC payload ID or independent repair FEC payload ID. It shall be set the same value on all of repair packets of a repair flow. When set to 1, it shall indicate that this packet carries a dependent repair FEC payload ID and when set to 0, it shall indicate that this packet carries an independent repair FEC payload ID. If independent repair FEC payload ID is not used, then this field is reserved for future use. |
| T (1 bit) | indicates whether timestamp field present or not. When set to 0, timestamp field shall not be present and when set to 1, timestamp field shall present. |
| SSM (2 bits) | indicates the size of the SS_start_seq_nr[i] field. The actual size of the SS_start_seq_nr[i] field is allocated to "8+8*SSM" bits. |
| RES (4 bits) | reserved for future use. |
| timestamp (32 bits) | indicates the timestamp of the first packet of source packet block which is protected by this repair packet. |
| SS_start _seq_nr[i] (8+8* SSM bits) | indicates LSB part (8+8*SSM bits) of the lowest packet_sequence_number of a packet with packet_id[i] in the source symbol block which is protected by this repair packet. |
| L[i] (2 bits) | provides the number of additional words in the SSB_length[i] field. |
| SSB_length[i] (6+8*L[i] bits) | indicates the number of packets with ith packet_ID of list_packet_ID field of the source symbol block which is protected by this repair packet. |
| L2 (2 bits) | provides the number of additional words in the RSB_length field. |

TABLE 5-continued

| Information | Detail |
| --- | --- |
| RSB_length (6+8*L2 bits) | the number of repair symbols generated in its associated repair symbol block. |
| L3 (2 bits) | provides the number of additional words in the RS_ID field. |
| RS_ID (6+8*L2 bits) | an integer number for identifying the first repair symbol in the FEC repair packet. It starts with 0 and is incremented by 1 with each repair symbol in its associated repair symbol block. |

Figure 6A:
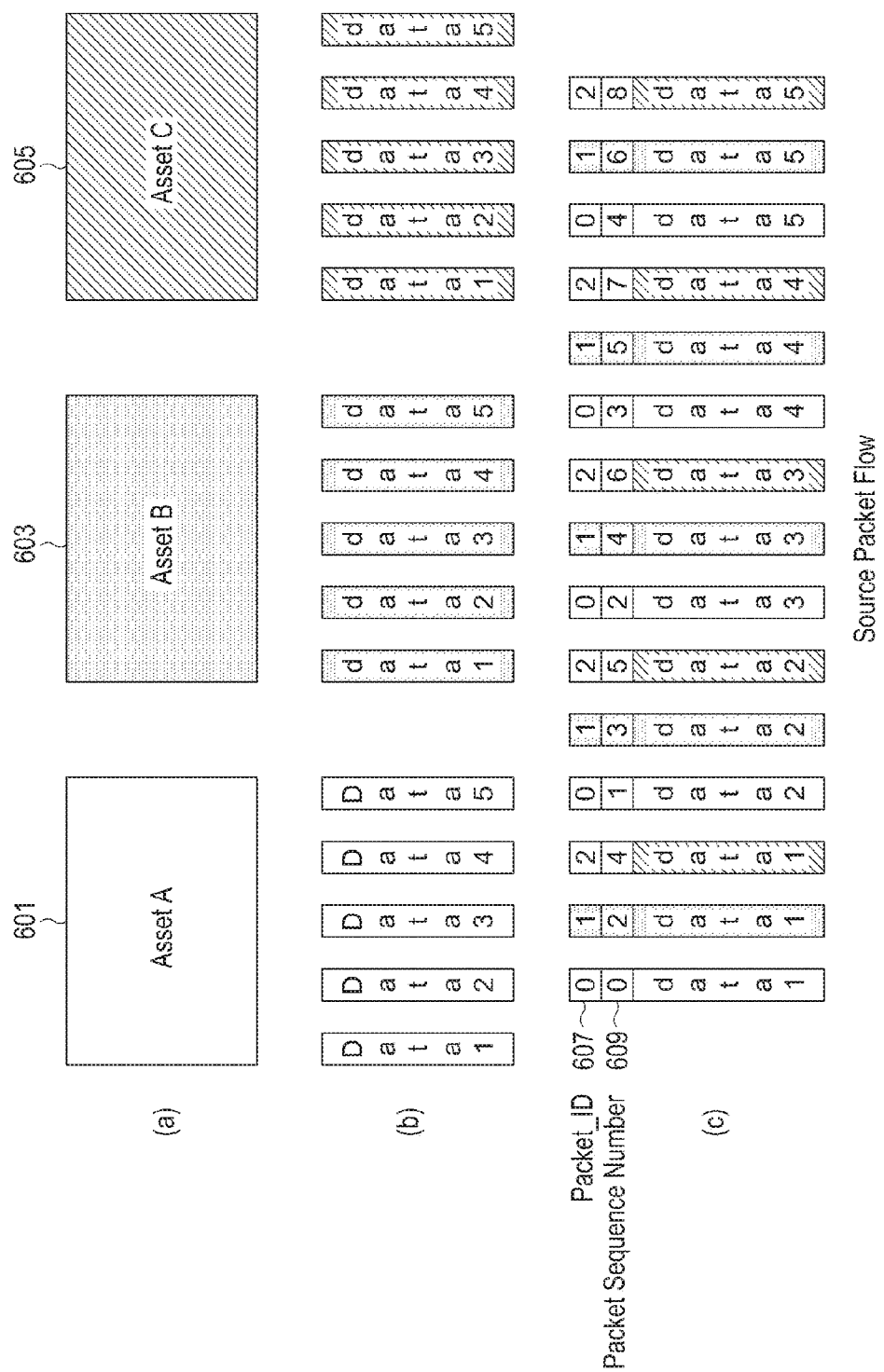
FIG. 6a is a view illustrating a method for configuring a source packet flow according to an embodiment of the present disclosure.

FIG. 6a is a view illustrating a method for generating a source packet flow according to an embodiment of the present disclosure.

Referring to FIG. 6a, when there are three Assets A, B, and C (601, 603, 605) (e.g. non-timed data or timed data such as Audio data, Video data, txt, File as shown in FIG. 6a(a), each Asset is separated into predetermined sizes of data, and is then added with MMT Payload Header, and MMT Packet Header to configure MMT Packet Flow (Source Packet Flow). As shown in FIG. 6a(b), each of Assets A, B, and C is separated into five data payloads, and as shown in FIG. 6a(c), each is added with the header including the Packet_ID 607 and Packet Sequence Number 609. Assignment is made as follows: Packet_ID=0 for identifying the packets of Asset A, Packet_ID=1 for Asset B, and Packet_ID=2 for Asset C, and such assignment is made so that the Packet Sequence Number based on each Packet_ID increases by one. An example of the header is the MMT packet header.

Figure 6B:
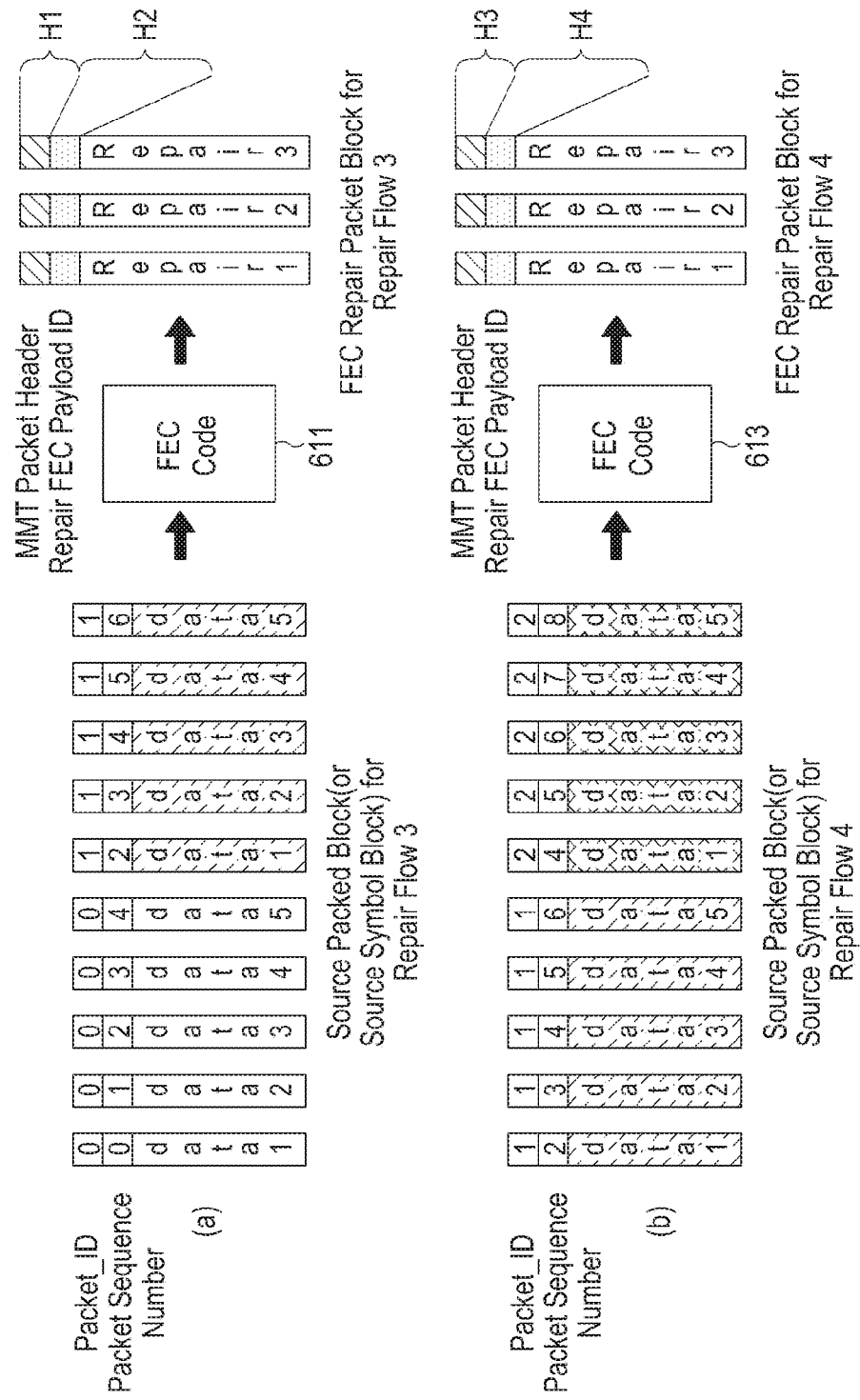
FIGS. 6b and 6c are views illustrating a method for configuring two FEC source packet flows from a source packet flow and generating one repair flow for each FEC source packet flow and examples of a MMT packet header and FEC repair payload ID according to an embodiment of the present disclosure.
Figure 6C:
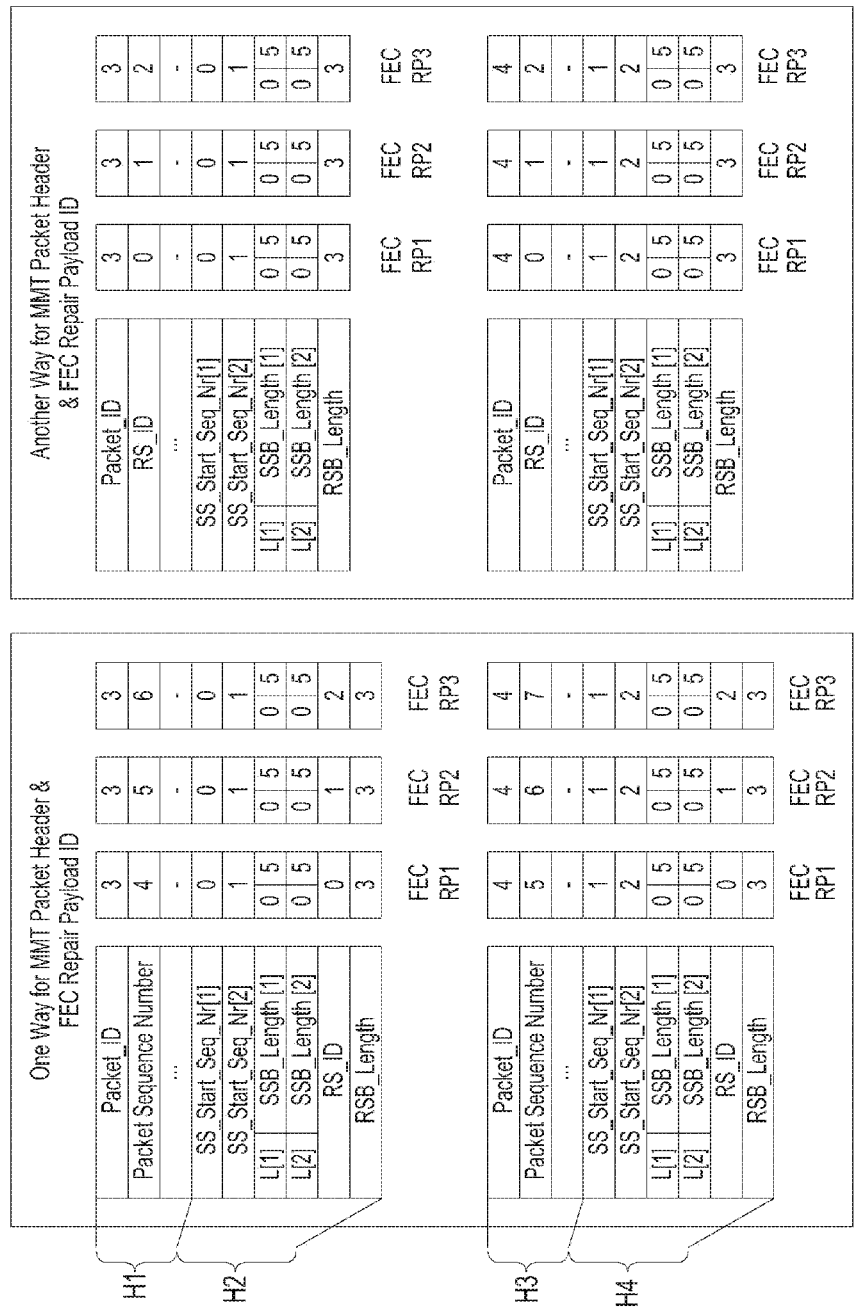

FIGS. 6b and 6c are views illustrating an FEC source packet flow and method for generating a repair flow according thereto according to an embodiment of the present disclosure. In FIGS. 6b and 6c, reference denotations H1 to H4 refer to their corresponding portions.

Referring to FIGS. 6b and 6c, from the source packet flow generated in FIG. 6a, FEC Source Packet Flow 1 consists of source packets generated from Assets A and B to generate FEC Source Packet Block 1 (or Source Symbol Block) (도 6b의 (a)), and FEC Source Packet Flow 2 consists of source packets generated from Asset B and Asset C to generate FEC Source Packet Block 2 (or Source Symbol Block) as shown in the drawings (도 6b의 (b)), and they respectively proceed with FEC encoding 611 and 613. From this, the FEC source packet block is converted into the source symbol block by a method for the SSBG_MODE's and is subjected to FEC encoding to generate FEC repair packets transmitting repair symbols. Although not shown, assuming that the location of the source packets in the source packet block is determined by order of transmission when generating the source symbol block from the source packet block, the location of the source symbol corresponding to each source packet may differ in the source symbol block. The source symbols should be arranged in the source symbol block based on the order of Packet_ID's specified in the repair FEC payload ID of repair packet. That is, in case the source packet block consists of Assets A and B, although the source packets for Asset A and Asset B are mixed in the source packet block, the source symbols for Asset A should be first arranged and the source symbols for Asset B should be then arranged in the source symbol block, or they should be arranged in an opposite order, and then, the Packet_ID's mapped to the Assets fitting the order of arrangement and the number of packet IDs included in the source packet block (or source symbol block) are listed in the FEC repair payload ID of the FEC repair packet. Otherwise, when the FEC source packet flow intended to be configured in the source packet flow as shown in FIGS. 6b and 6c is configured, and each source packet block (or source symbol block) is configured, the packets for Asset A are first arranged in the source packet block (or source symbol block), and the packets for Asset B are arranged, and the Packet_ID's are listed based on the order or number of Packet_ID's accordingly. Preferably, since the source packet flow is the stream of source packets based on actual order of transmission, the source packets corresponding to the Packet_ID of the source packet first transmitted among the source packets for each source packet block are first arranged in the source packet block (or source symbol block), and the source packets corresponding to the next Packet_ID are arranged.

Figure 7A:
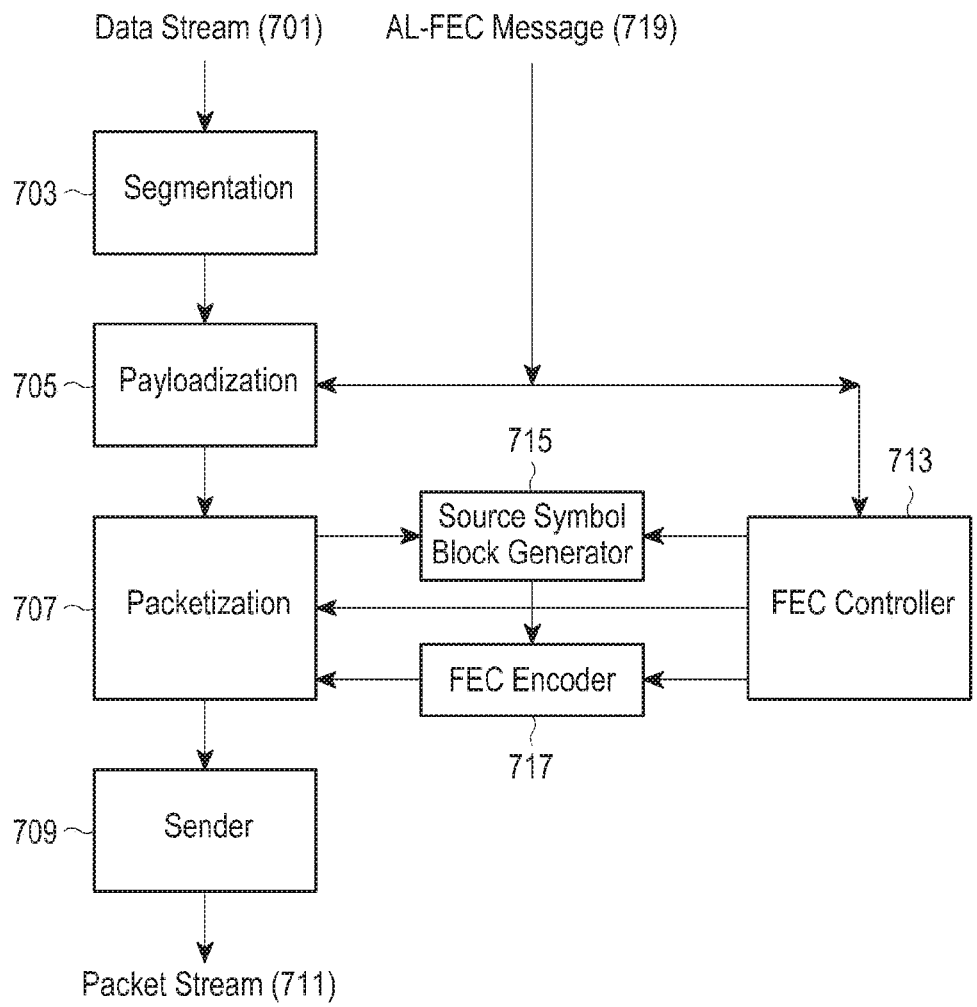
FIG. 7a is a view illustrating an operation of a transmitter for packet protection according to an embodiment of the present disclosure.
Figure 7B:
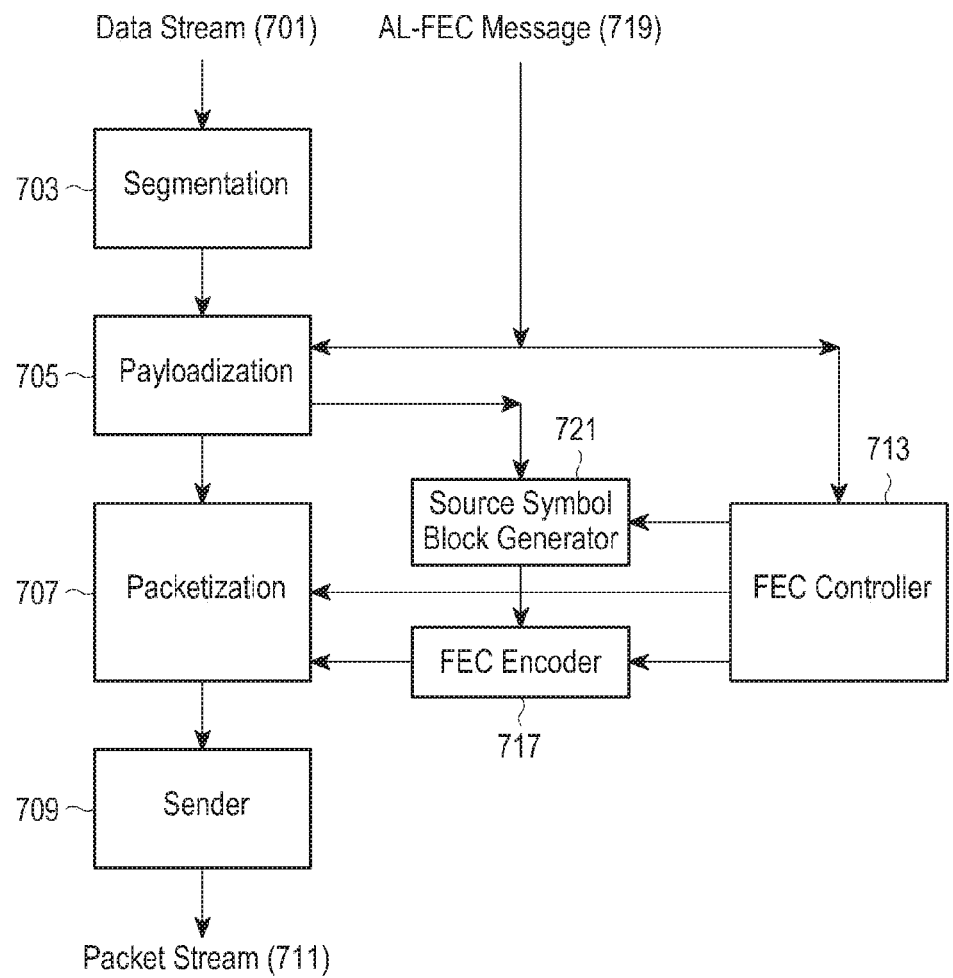
FIG. 7b is a view illustrating an operation of a transmitter for payload protection according to an embodiment of the present disclosure.

FIGS. 7a and 7b are views illustrating the operation of a transmitter for packet protection and payload protection according to an embodiment of the present disclosure. FIG. 7a illustrates the operation of the transmitter for packet protection, and FIG. 7b illustrates the operation for payload protection.

Referring to FIGS. 7a and 7b, first, the Data Stream 701 is transmitted via Segmentation 703, Payloadization 705, and Packetization 707, to the packet stream 711 by the transmitting unit 709. Taking MMT as an example, an arrangement may be made so that Data Stream (701)=Asset. Segmentation 703 divides data in predetermined sizes. Payloadization 705 adds header to the data, and the header stores information capable for reconfiguring the data from the packet received from the receiver. As an example, MMT payload corresponds to this. Packetization 707 adds MMT packet header to MMT Payload. The MMT Packet Header has Packet_ID and Packet Sequence Number and is thus utilized for FEC.

Further, in case Packet Protection is performed as shown in FIG. 7a, the MMT packets to be FEC protected are inputted to Source Symbol Block Generator 715 under the control of FEC Controller 713. Source Symbol Block Generator 715 generates Source Symbol Block from MMT Packets (Source Packets) (refer to the example of FIG. 10), FEC encoder 717 receives the Source Symbol Block to generate Repair Symbols, and each Repair Symbol adds MMT Packet Header and FEC Repair Payload ID and it is transmitted in FEC Repair Packet. The repair FEC Payload ID may be configured as in Table 5 above according to the present disclosure. AL-FEC Message 719 passes through Payloadization 705, that is, adds MMT Payload Header, and then adds MMT Packet Header and it is transmitted in a packet separate from the data. Further, as shown in FIG. 7b, in case Payload protection is performed, it is the same as the Packet Protection operation described in connection with FIG. 7a except that MMT Payload or Payload data is inputted to Source Symbol Block Generator 721.

Figure 8A:
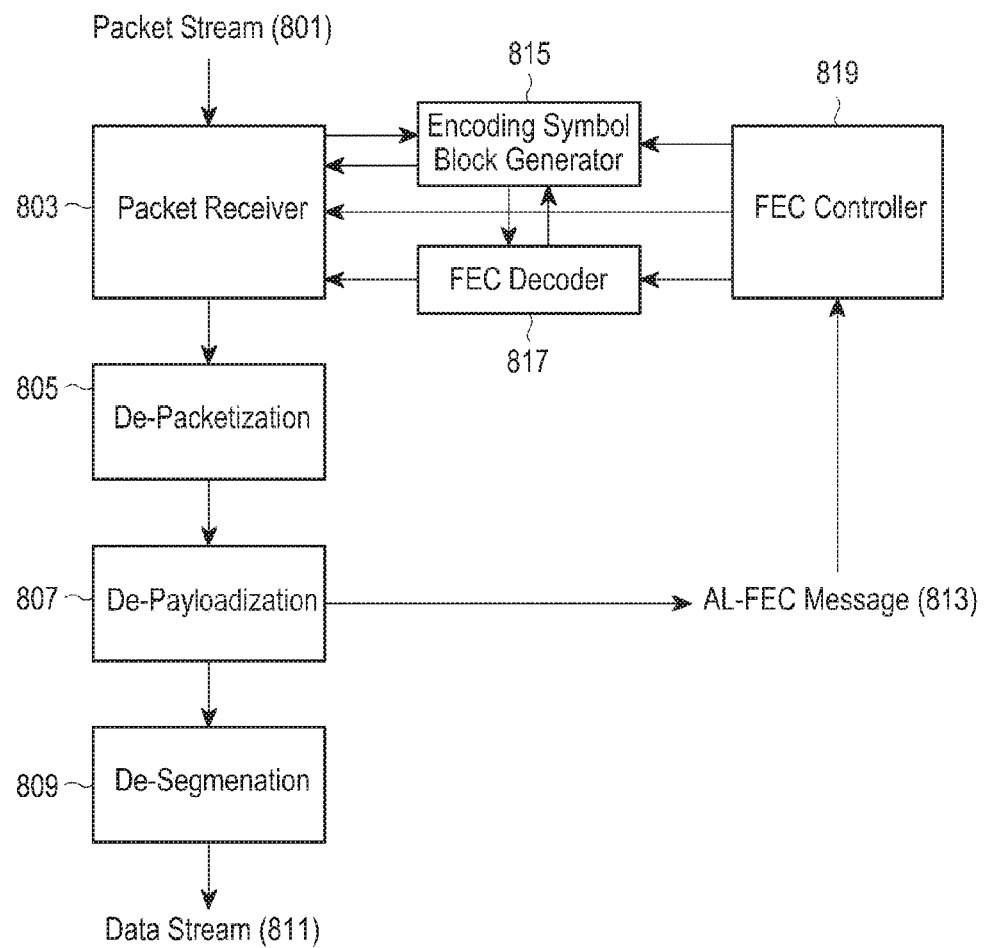
FIG. 8a is a view illustrating an operation of a receiver for packet protection according to an embodiment of the present disclosure.
Figure 8B:
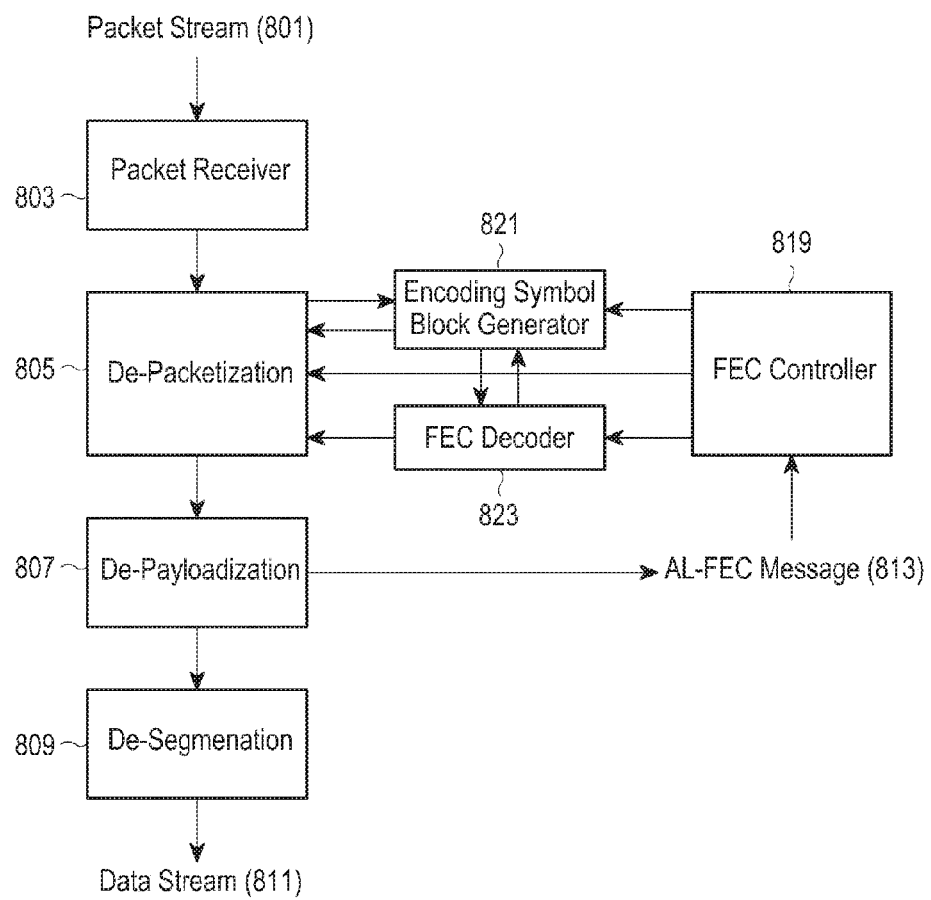
FIG. 8b is a view illustrating an operation of a receiver for payload protection according to an embodiment of the present disclosure.

FIGS. 8a and 8b are views illustrating the operation of a receiver for packet protection and payload protection. FIG. 8a illustrates the operation of the receiver for packet protection, and FIG. 8b illustrates the operation of the receiver for payload protection.

Referring to FIGS. 8a and 8b, the receiver, if receiving the Packet Stream 801 through the Packet receiving unit 803, differentiates whether the received packet is the source packet or FEC repair packet. In case several types of source packets (e.g., in case MMP packets (conventional art) having a separate SS_ID and MMP packets with no such IDs (present disclosure) coexist) and several types of FEC repair packets (e.g., in case FEC repair packets according to the conventional art and FEC repair packets according to the present disclosure coexist) coexist, information to differentiate the information is present in the MMT packet header, and the receiver differentiates the packets based on the information. The differentiated packets are restored into the data stream 811 while passing De-packetization (e.g. MMT De-packetization or Parse) 803, De-payloadization (MMT Payload Depayloadization or Parse) 807, and De-segmentation 809.

Further, as shown in FIG. 8a, as an operation of the receiver in case packet protection applies, the receiver grasps basic information regarding the FEC configuration necessary for FEC decoding from the AL-FEC message 813. In case the received packet is the repair packet, the source packets protected by the repair packet from other information than number (or respective numbers) of Packet_ID's (# of Packet_IDs), List of Packet_IDs, List of SS_Start_Seq_Nrs, List of SSB_Length[ ] listed in the FEC repair payload ID and Packet_ID in the MMT packet header and the repair symbols of the repair packet are recognized, and the received Source Packet (MMT Packet) is inputted to Encoding Symbol Generator 815 under the control of FEC Controller 819. Encoding Symbol Generator 815 converts the source packet into source symbol according to the SSBG mode given from the Source Packet, and it together with the repair symbols constitutes Encoding Symbol Block. FEC Decoder 817 restores the lost source symbol using the repair symbols to obtain the source packet. Then, source packet is transferred to De-packetiztion 805.

Further, in case payload protection is applied as shown in FIG. 8b, the same operation in light of information utilization of MMT Packet Header and utilization of FEC Repair Payload ID information of FEC repair packet as the packet protection operation of FIG. 8a applies except that not packet but payload is restored by Encoding Symbol Generator 821 and FEC Decoder 823.

Figure 9:
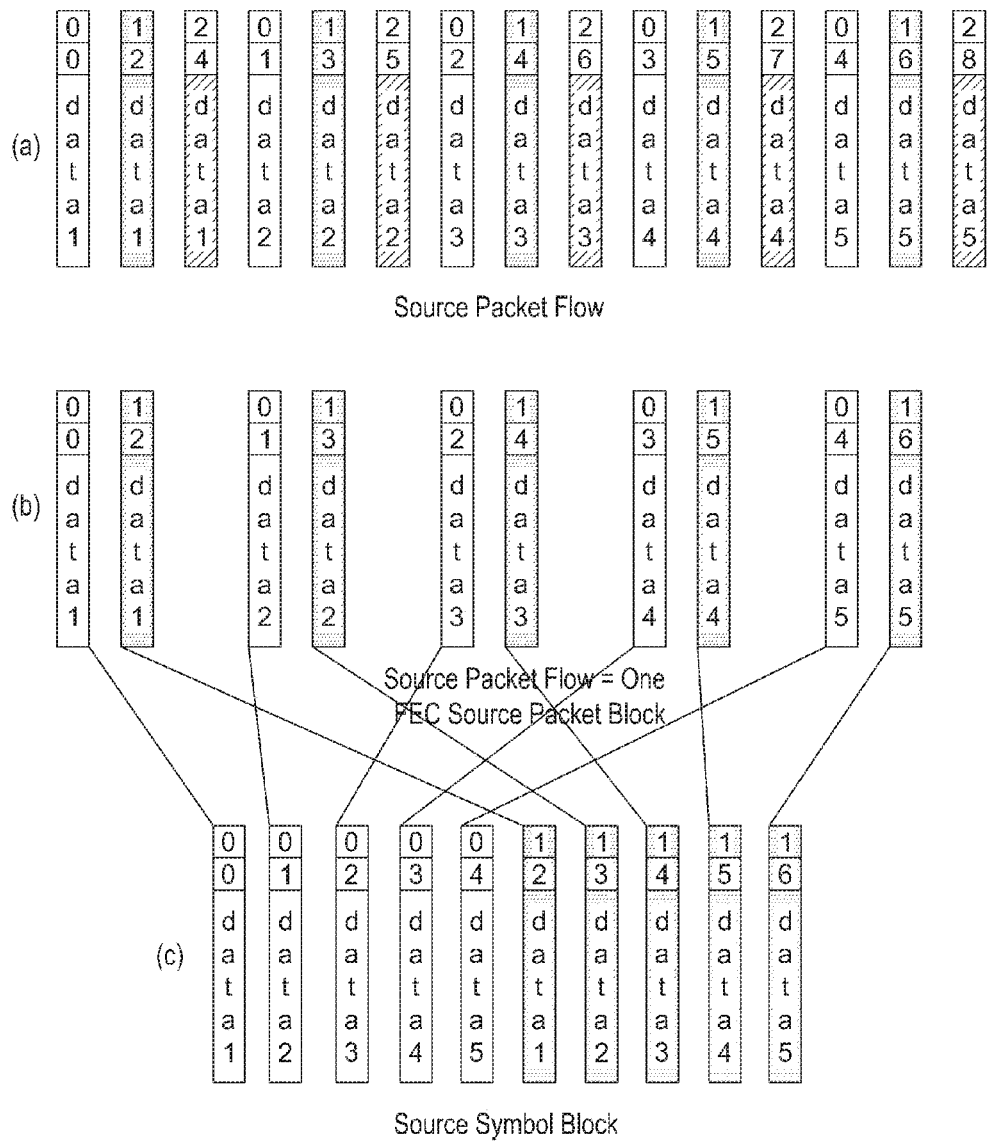
FIG. 9 is a flowchart illustrating an operation configuring a source symbol block according to an embodiment of the present disclosure.

FIG. 9 is a view illustrating an example of generating a source packet block (or source symbol block) according to an embodiment of the present disclosure.

In the example shown in FIG. 9, from the flow of packets consisting of three Packet_ID's (FIG. 9(*a*)), packets corresponding to two Packet_ID's having packet_ID=0 or 1 are selected to configure FEC Source Packet Flow (=1 Source Packet Block) (FIG. 9(*b*)), and the packets having PacketID=0 are first arranged, and then, packets having Packet_ID=1 are arranged to generate the source symbol block (FIG. 9(*c*)). If the source packets have different lengths upon conversion from Source Packet to Source Symbol, padding is needed (SSBG_MODE1), and if they are of the same length, padding is not required (SSBG_MODE0).

Hereinafter, a basic concept of another embodiment of the present disclosure is described.

Another Embodiment

A method for transmitting packets in a communication system according to another embodiment of the present disclosure is described. The transmitter generates the MMT packet for signaling message and Assets to be transmitted as set forth in MPEG output document w13982. The transmitter determines FEC configuration information such as the number of Packet_ID's subjected to FEC protection, size of repair symbol to be generated, window protection time, and FEC code to be applied to the MMT packet corresponding to the Assets, i.e., source packets, subject to FEC protection among the Assets and performs FEC encoding to generate the repair symbol block as specified in w13982 as an example. The transmitter adds the repair FEC payload ID proposed herein to the repair symbol(s) of the repair symbol block to generate and transmit the FEC repair packet.

Here, the repair FEC payload ID according to the present disclosure includes at least one information of M, T, SSM, PM, C, W, timestamp, number (or respective numbers) of packet_ID's (# of packet_ID), packet_ID List, CP, PWT, RS_length, SS_start_seq_nr[0]~[N−1], L[0]~[N−1], SSB_length [0]~[N−1], L2,RSB_length, L3, and RS_ID. The FEC repair payload ID may be included in the header of the FEC repair packet.

Hereinafter, each information that may be included in the FEC repair payload ID is described in detail.

"M" may obtain information necessary for FEC decoding processing in a combination of information indicating whether the repair FEC payload ID of repair packet is dependent repair FEC payload ID or independent repair FEC payload ID (Dependent repair FEC payload ID definition, information stored in information different from the information in repair FEC payload ID (e.g. AL-FEC message or Independent repair FEC payload ID). In an opposite concept, the Independent repair FEC payload ID indicates that information necessary for FEC decoding processing may be obtained with only the information of the packet including the Independent repair FEC payload ID without the information stored in the AL-FEC message.

"T" is flag information indicating whether there is timestamp field.

"SSM" is information indicating the size of SS_start_seq_nr field (e.g., size of SS_start_seq_nr field (in bits)=8+8*SSM).

"PM" indicates whether the overall MMT flow is protected, one packet_ID is protected, two packet_ID's are protected, or three or more packet_ID's are protected.

"C" indicates whether there is CP (Code Point) field, and "W" indicates whether there is PWT (Protection Window Time) field.

"timestamp" denotes the timestamp stored in the first source packet of the source packet block protected by the repair packet.

The number (or respective numbers) of packet_ID's (# of packet_ID) field is a field present when the PM indicates that three or more Packet_ID's are protected, and this indicates information on the number of packet_ID's.

"Packet_ID list" field lists the Packet_ID's and this is not provided when the PM indicates that the overall MMT flow is protected.

"CP (Code Point)" field is provided when C flag is on, and this indicates the code point of the FEC code used to generate the repair packet.

"PWT" is provided in case W flag is on and this indicates the FEC packet block Window time constituted of the FEC source packet block and the FEC repair packet block in the repair flow including the repair packet (as an example, Protection Window Time as specified in W13982 may be used).

"RS_length" indicates the size information on repair symbol.

"SS_start_seq_nr[i]" denotes the LSB value as large a size as 8+8*SSM bits in the lowest packet sequence number among source packets of the source packet block having the ith packet_ID value in the source flow described in the AL-FEC message (e.g., if packet_sequence_number is 32 bits, and 8+8*SSM is 24 bits, the remaining 24-bit value except for the first 8 bits in the packet_sequence_number. Accordingly, the start sequence number of the source packets of the source packet (or symbol) block may be known through "SS_start_seq_nr[i]".

"L[i]" is information indicating the size of SSB_length[i] field and is given as SSB_length field size=6+8*L.

"SSB_length[i]" is the number (i=0, 1, . . . , N−1) of the source packets of the source packet block having the ith packet_ID value in the source flow specified in the AL-FEC message, and "L2" is information indicating the size of RSB_length field and this is given as RSB_length field size=6+8*L2.

"RSB_length" is information on the number of repair symbols of the repair symbol block included in the repair packet, L3 is information indicating the size of RS_ID field and this is given as RS_ID field size=6+8*L2, and "RS_ID" indicates the position of repair symbol(s) in the repair packet in the repair symbol block including the repair packet (e.g., indicating what number of repair symbol it is).

According to an embodiment of the present disclosure, the transmitting device includes a controller generating the MMT packets for signaling message and Assets to be transmitted, e.g., as specified in MPEG output document w13982, determining FEC configuration information such as the number of Packet_ID's subjected to FEC protection, size of repair symbol to be generated, window protection time, and FEC code to be applied to the MMT packet corresponding to the Assets, i.e., source packets, subject to FEC protection among the Assets and performing FEC encoding to generate the repair symbol block as specified in w13982 and adding the repair FEC payload ID proposed herein to the repair symbol(s) of the repair symbol block to generate and transmit the FEC repair packet.

Here, the repair FEC payload ID according to the present disclosure includes at least one information of M, T, SSM, PM, C, W, timestamp, # of packet_ID, packet_ID List, CP, PWT, RS_length, SS_start_seq_nr[0]~[N−1], L[0]~[N−1], SSB_length [0]~[N−1], L2, RSB_length, L3, and RS_ID.

Another transmission method according to an embodiment of the present disclosure is described. As specified in MPEG output document w13982, in generating and transmitting the MMT packets for the Signaling message and Assets to be transmitted, an intermediate node in the network (e.g., Contribution Network) determines the Asset(s) and FEC configuration for FEC protection. Further, the intermediate Node determines the Packet_ID list mapped to the Asset(s) based on the Asset(s) for FEC protection and FEC configuration information and repair flow ID mapped thereto. The intermediate Node generates the repair symbol block protecting the MMT packet corresponding to the Asset(s), sets the repair flow ID value in the Packet_ID in the repair symbol(s) of the generated repair symbol block, adds the repair FEC payload ID according to the present disclosure to generate the FEC repair packet (MMT packet).

Here, the repair FEC payload ID according to the present disclosure includes at least one of M, T, SSM, PM, C, W, timestamp, # of packet_ID, packet_ID List, CP, PWT, RS_length, SS_start_seq_nr[0]~[N−1], L[0]~[N−1], SSB_length [0]~[N−1], L2,RSB_length, L3, and RS_ID.

According to an embodiment of the present disclosure, another transmitting device is included in the intermediate Node of the network (e.g., Configuration Network). The transmitting device of the intermediate Node includes a transmitting unit, an encoding unit performing FEC encoding, and a controller controlling the operations of determining the FEC configuration information and Asset(s) for FEC protection in generating and transmitting MMT packets for a signaling message and Assets to be transmitted, determining the Packet_ID list mapped to the Asset(s) based on the Asset(s) for FEC protection and FEC configuration information and repair flow ID mapped thereto, performing FEC encoding through the encoding unit to generate the repair symbol block protecting the MMT packet corresponding to the Asset(s), setting the repair flow ID value in the Packet_ID in the repair symbol(s) of the generated repair symbol block, and adding the repair FEC payload ID according to the present disclosure to generate the FEC repair packet (MMT packet).

Here, the repair FEC payload ID according to the present disclosure includes at least one of M, T, SSM, PM, C, W, timestamp, # of packet_ID, packet_ID List, CP, PWT, RS_length, SS_start_seq_nr[0]~[N−1], L[0]~[N−1], SSB_length [0]~[N−1], L2,RSB_length, L3, and RS_ID. A receiving method according to an embodiment of the present disclosure is described. The receiver differentiates the received packet as to whether it is the source packet or FEC repair packet. The receiver obtains the repair symbol from the FEC repair packet, recognizes, from the repair FEC payload ID of the FEC repair packet, the protection mode protected by the FEC repair packet (i.e., whether the overall MMT flow is protected, or one, two, or more Packet_ID's are protected), if the overall MMT flow is protected, obtains the source packets based on the SSB_length information and the SS_start_seq_nr's of the repair FEC payload ID and the packet_count field of the received source packet, or unless the overall MMT flow is protected, obtains the source packet corresponding to the source packet block from the received packet based on the number of Packet_ID's protected, Packet_ID list, SS_start_seq_nr, and SSB_length from the repair FEC payload ID information to configure the encoding symbol block, along with the repair symbols. The receiver performs FEC decoding on the configured encoding symbol block and obtains the source packet of the source packet block lost during transmission from the restored source symbol.

According to an embodiment of the present disclosure, the receiver may include a receiving unit, a decoding unit performing FEC decoding, and a controller controlling the operations of differentiating whether the packet received from the transmitter by the receiving unit is the source packet or FEC repair packet, obtaining the repair symbol from the FEC repair packet, recognizes, from the repair FEC payload ID of the FEC repair packet, the protection mode protected by the FEC repair packet (i.e., whether the overall MMT flow is protected, or one, two, or more Packet_ID's are protected), if the overall MMT flow is protected, obtains the source packets based on the SSB_length information and the SS_start_seq_nr's of the repair FEC payload ID and the packet_count field of the received source packet, or unless the overall MMT flow is protected, obtaining the source packet corresponding to the source packet block from the received packet based on the number of Packet_ID's protected, Packet_ID list, SS_start_seq_nr, and SSB_length from the repair FEC payload ID information to configure the encoding symbol block, along with the repair symbols, performing FEC decoding on the configured encoding symbol block through the decoding unit to restore the source symbol, and obtaining the source packet of the source packet block lost during transmission from the restored source symbol.

A transmitting method according to another embodiment of the present disclosure is described. The transmitter generates the MMT packet for signaling message and Assets to be transmitted as set forth in MPEG output document w13982. The transmitter determines FEC configuration information such as the number of Packet_ID's subjected to FEC protection, size of repair symbol to be generated, window protection time, and FEC code to be applied to the MMT packet corresponding to the Assets, i.e., source packets, subject to FEC protection among the Assets. The transmitter includes the independent repair FEC payload ID in at least one repair packet of the repair packets protecting the source packet block in performing FEC encoding to generate the repair symbol block as specified in w13982 and adding the repair FEC payload ID proposed herein to the repair symbol(s) of the repair symbol block to generate and transmit the FEC repair packet.

According to an embodiment of the present disclosure, the transmitting device includes a transmitting unit, an encoding unit performing FEC encoding, and a controller controlling the operations of generating the MMT packets for signaling message and Assets to be transmitted, e.g., as specified in MPEG output document w13982, determining FEC configuration information such as the number of Packet_ID's subjected to FEC protection, size of repair symbol to be generated, window protection time, and FEC code to be applied to the MMT packet corresponding to the Assets, i.e., source packets, subject to FEC protection among the Assets and including the independent repair FEC payload ID in at least one repair packet of the repair packets protecting the source packet block in performing FEC encoding to generate the repair symbol block as specified in w13982 and adding the repair FEC payload ID proposed herein to the repair symbol(s) of the repair symbol block to generate and transmit the FEC repair packet.

Another transmission method according to an embodiment of the present disclosure is described. As specified in MPEG output document w13982, in generating and transmitting the MMT packets for the Signaling message and Assets to be transmitted, an intermediate node in the network (e.g., Contribution Network) determines the Asset(s) and FEC configuration for FEC protection. The intermediate Node determines the Packet_ID list mapped to the Asset(s) based on the Asset(s) for FEC protection and FEC configuration information and repair flow ID mapped thereto and generates the repair symbol block protecting the MMT packet corresponding to the Asset(s). The intermediate Node includes and transmits the independent repair FEC payload ID in at least one repair packet among the repair packets protecting the source packet block in setting the repair flow ID value in the Packet_ID in the repair symbol(s) of the generated repair symbol block and adding the repair FEC payload ID according to the present disclosure to generate the FEC repair packet (MMT packet).

According to an embodiment of the present disclosure, another transmitting device is included in the intermediate Node of the network (e.g., Configuration Network). The transmitting device of the intermediate Node includes a transmitting unit, an encoding unit performing FEC encoding, and a controller controlling the operations of determining the FEC configuration information and Asset(s) for FEC protection in generating and transmitting MMT packets for a signaling message and Assets to be transmitted, determining the Packet_ID list mapped to the Asset(s) based on the Asset(s) for FEC protection and FEC configuration information and repair flow ID mapped thereto, performing FEC encoding through the encoding unit to generate the repair symbol block protecting the MMT packet corresponding to the Asset(s), and including and transmitting the independent repair FEC payload ID in at least one repair packet of the repair packets protecting the source packet block in setting the repair flow ID value in the Packet_ID in the repair symbol(s) of the generated repair symbol block, and adding the repair FEC payload ID according to the present disclosure to generate the FEC repair packet (MMT packet).

A receiving method according to an embodiment of the present disclosure is described. The receiver differentiates whether the packet received from the transmitter is the source packet or FEC repair packet and obtains at least one independent repair FEC payload ID from the FEC repair packet to obtain the repair symbol. The receiver recognizes, from the repair FEC payload ID of the FEC repair packet, the protection mode protected by the FEC repair packet (i.e., whether the overall MMT flow is protected, or one, two, or more Packet_ID's are protected), if the overall MMT flow is protected, obtains the source packets based on the SSB_length information and the SS_start_seq_nr's of the repair FEC payload ID and the packet_count field of the received source packet, or unless the overall MMT flow is protected, obtains the source packet corresponding to the source packet block from the received packet based on the number of Packet_ID's protected, ssbg_mode, Packet_ID list, SS_start_seq_nr, and SSB_length from the repair FEC payload ID information to configure the encoding symbol block, along with the repair symbols. The receiver performs FEC decoding on the configured encoding symbol block and obtains the source packet of the source packet block lost during transmission from the restored source symbol.

According to an embodiment of the present disclosure, the receiver may include a receiving unit, a decoding unit performing FEC decoding, and a controller controlling the operations of differentiating whether the packet received from the transmitter by the receiving unit is the source packet or FEC repair packet and obtaining at least one independent repair FEC payload ID from the FEC repair packet, obtaining the repair symbol, recognizes, from the repair FEC payload ID of the FEC repair packet, the protection mode protected by the FEC repair packet (i.e., whether the overall MMT flow is protected, or one, two, or more Packet_ID's are protected), if the overall MMT flow is protected, obtains the source packets based on the SSB_length information and the SS_start_seq_nr's of the repair FEC payload ID and the packet_count field of the received source packet, or unless the overall MMT flow is protected, obtaining the source packet corresponding to the source packet block from the received packet based on the number of Packet_ID's protected, ssbg_mode, Packet_ID list, SS_start_seq_nr, and SSB_length from the repair FEC payload ID information to configure the encoding symbol block, along with the repair symbols, performing FEC decoding on the configured encoding symbol block through the decoding unit to restore the source symbol, and obtaining the source packet of the source packet block lost during transmission from the restored source symbol.

The header of the source packet or FEC repair packet includes information for differentiating the source packet or FEC repair packet. In case a packet transmission method adding a separate source symbol ID (SS_ID) for letting the order os source symbols in the source symbol block known to the source packet and packet transmission method according to the present disclosure are used together, the header of the FEC repair packet or source packet according to the present disclosure includes at least one of information differentiating whether

- Source Packet+SS_ID;
- Source Packet itself (present disclosure);
- FEC Repair Packet according to the conventional invention; and
- FEC repair packet according to the present disclosure.

The following Table 6 represents an embodiment of the FEC type of MMT packet header.

TABLE 6

| Value | Description |
| --- | --- |
| 0 | MMT packet without FEC Source Payload ID |
| 1 | MMT packet with FEC Source Payload ID |
| 2 | MMT packet for repair symbol(s) for FEC Payload Mode 0 (FEC repair packet) |
| 3 | MMT packet for repair symbol for FEC Payload Mode 1 (FEC repair packet) |

NOTE,
If FEC type is set to 0, it indicates that FEC is not applied to this MMT packet or that FEC is applied to this MMT packet without adding FEC Source Payload ID.

Further, such information for differentiating packets has the Payload ID_Mode Flag indicating whether FEC applies and packets are transmitted in the legacy method through the AL_FEC message or FEC applies and transmission is performed according to the present disclosure and it is transmitted to the receiving terminal.

Payload ID_Mode Flag=1, packet transmission method applying FEC according to the present disclosure (that is, without using a separate SS_ID in the source packet, follows the FEC repair packet format (particularly, repair FEC Payload ID). In this case, use of the information (e.g., sequence number of source packet) in the source packet allows the order of the source packets (or symbols) having the same packet ID in the source packet (or symbol) block to be identified as if it is done by using SS_ID.

Payload ID_Mode Flag=0, packet transmission method applying FEC as in the conventional invention (that is, the source packet adds a separate SS_ID and follows the FEC repair packet format (particularly, repair FEC Payload ID) according to the conventional invention.)

Hereinafter, other embodiments of the present disclosure are described with respect to the drawings.

The features of the present disclosure described above in the above embodiments may be selectively applied to other embodiments of the present disclosure.

Figure 12:
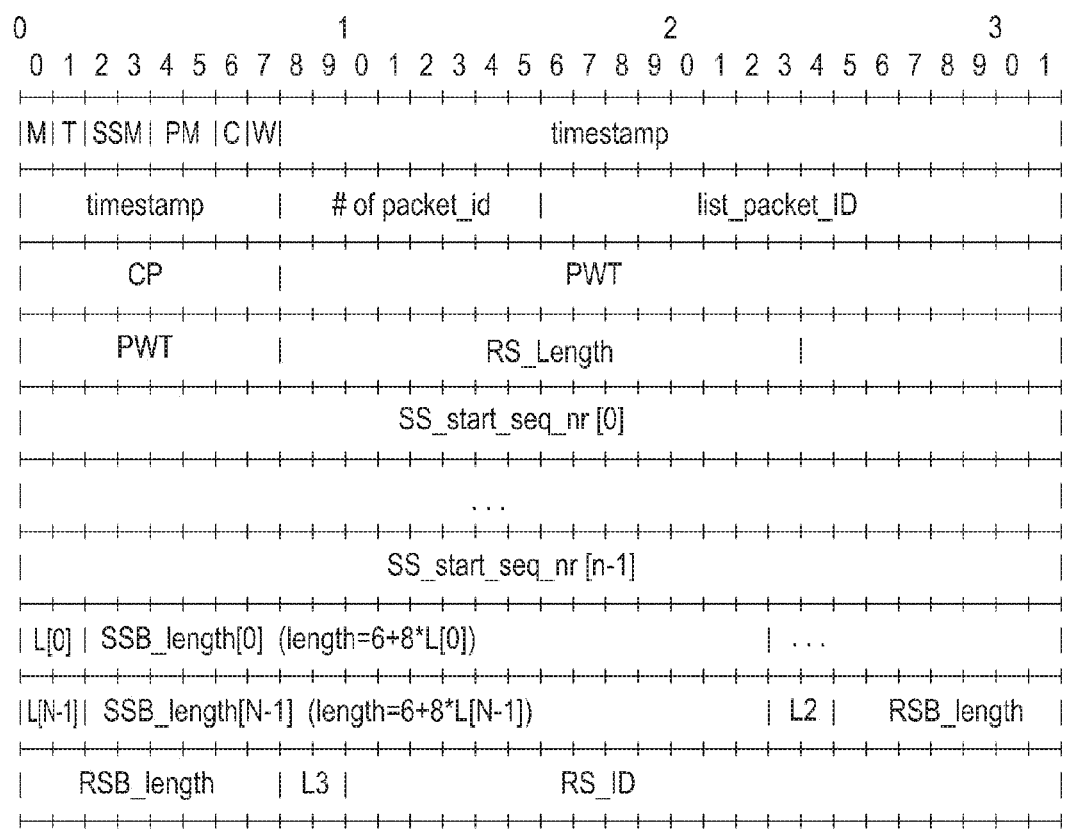
FIG. 12 is a view illustrating an example of a configuration of a repair FEC payload ID according to an embodiment of the present disclosure.

FIG. 12 is a view illustrating an example of a configuration of a repair FEC payload ID according to an embodiment of the present disclosure.

The details of each information shown in FIG. 12 are shown in Tables 7 to 9 below.

TABLE 7

| information | Detail |
| --- | --- |
| M (1 bit) | indicates whether this repair packet carries dependent repair FEC payload ID or independent repair FEC payload ID. When set to 1, it shall indicate that this packet carries a dependent repair FEC payload ID and when set to 0, it shall indicate that this packet carries an independent repair FEC payload ID. |
| T (1 bit) | indicates whether timestamp field present or not. When set to 0, timestamp field shall not be present and when set to 1, timestamp field shall present. |
| SSM (2 bits) | indicates the size of the SS_start_seq_nr[i] field. The actual size of the SS_start_seq_nr[i] field is allocated to "8+8*SSM" bits. |
| PM (2 bits) | defines a source flow to be protected. The same value shall be set to this field of all repair packets for a repair flow. |
| C (1 bit) | indicates whether Code Point field present or not. When set to 0, Code Point field shall not be present and pre-determined Code Point is used. When set to 1, Code Point field shall be present. |
| W (1 bit) | indicates whether Protection Window Time field present or not. When set to 0, Protection Window Time field shall not be present. When set to 1, Protection Window Time field shall be present. |

TABLE 7-continued

| information | Detail |
| --- | --- |
| timestamp (32 bits) | indicates the timestamp of the first packet of source packet block which is protected by this repair packet. |
| # of packet_id (6 bits) | indicates the number of packet_ids which consists of a source flow to be protected. This field shall only present when PM set to 3. The same value shall be set to this field of all repair packets for a repair flow. |

TABLE 8

| information | Detail |
| --- | --- |
| ssbg_mode (2bits) | indicates the applied source symbol block generation mode to the source packet block which is protected by this repair packet. |
| list_packet_id (Num*16 bits) | provides list of packet_ID to be protected by a repair flow for this packet. When PM set to 0, then this field shall not present, when PM set to 1 or 2 then Num = 1 or 2, respectively and when PM set to 3, Num = # of packet_id. The same value shall be set to this field of all repair packets for a repair flow. |
| CP (8 bits) | indicates the Code Point which is used to generate the repair flow. This field shall only present when C set to 1. The same value shall be set to this field of all repair packets for a repair flow. |
| PWT (32 bits) | indicates Protection Window Time of FEC source or repair packet block which is relevant to this repair packet. This field shall only present when W set to 1. The same value shall be set to this field of all repair packets for a repair flow. |
| RS_length (16 bits) | indicates the length(in bytes) of repair symbol. The same value shall be set to this field of all repair packets for a repair flow. |
| SS_start_seq_nr[i] (8+8*SSM bits) | If PM set to 0, it indicates LSB part (8+8*SSM bits) of the lowest packet_count of a packet in the source symbol block which is protected by this repair packet. Otherwise, it indicates LSB part (8+8*SSM bits) of the lowest packet_sequence_number of a packet with the ith packet_ID of list_packet_ID field in the source symbol block which is protected by this repair packet (i=0,1,...,Num-1). |

TABLE 9

| information | Detail |
| --- | --- |
| L[i] (2 bits) | provides the number of additional words in the SSB_length[i] field. |
| SSB_length[i] (6+8*L[i] bits) | indicates the number of packets with ith packet_ID of list_packet_ID field of the source symbol block which is protected by this repair packet. |
| L2 (2 bits) | provides the number of additional words in the RSB_length field. |
| RSB_length (6+8*L2 bits)- | the number of repair symbols generated in its associated repair symbol block. |
| L3 (2 bits) | provides the number of additional words in the RS_ID field. |
| RS_ID (6+8*L2 bits) | an integer number for identifying the first repair symbol in the FEC repair packet. It starts with 0 and is incremented by 1 with each repair symbol in its associated repair symbol block. |

Note,
If the field M indicates that this repair packet carries dependent repair FEC payload ID, then PM, C and W fields are reserved.
2) If the field M indicates that this repair packet carries dependent repair FEC payload ID, then # of packet_id, list_packet_id, CP, PWT and RS_length fields shall not be present.

The protection mode of the source flow protected in the "PM" field of Table 7 above may be defined as in Table 10, for example.

TABLE 10

| Value | Description |
|---|---|
| 0 | Whole MMT flow is protected. (packet_count filed in MMT packet headers shall be present) |
| 1 | A source flow, which consists of one packet_id, is protected. |
| 2 | A source flow, which consists of two packet_ids, is protected. |
| 3 | A source flow, which consists of more than two packet_ids, is protected. |

Figure 17A:
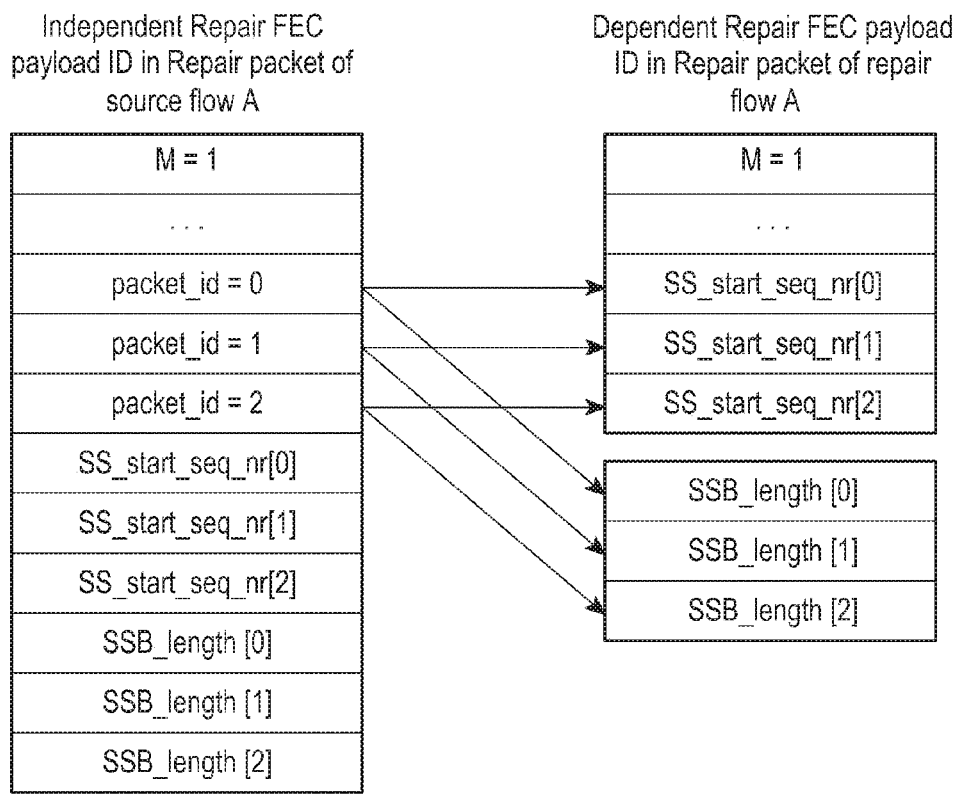
FIG. 17a is a view illustrating a relation between an independent repair FEC payload ID and dependent repair FEC payload ID according to another embodiment of the present disclosure.
Figure 17B:
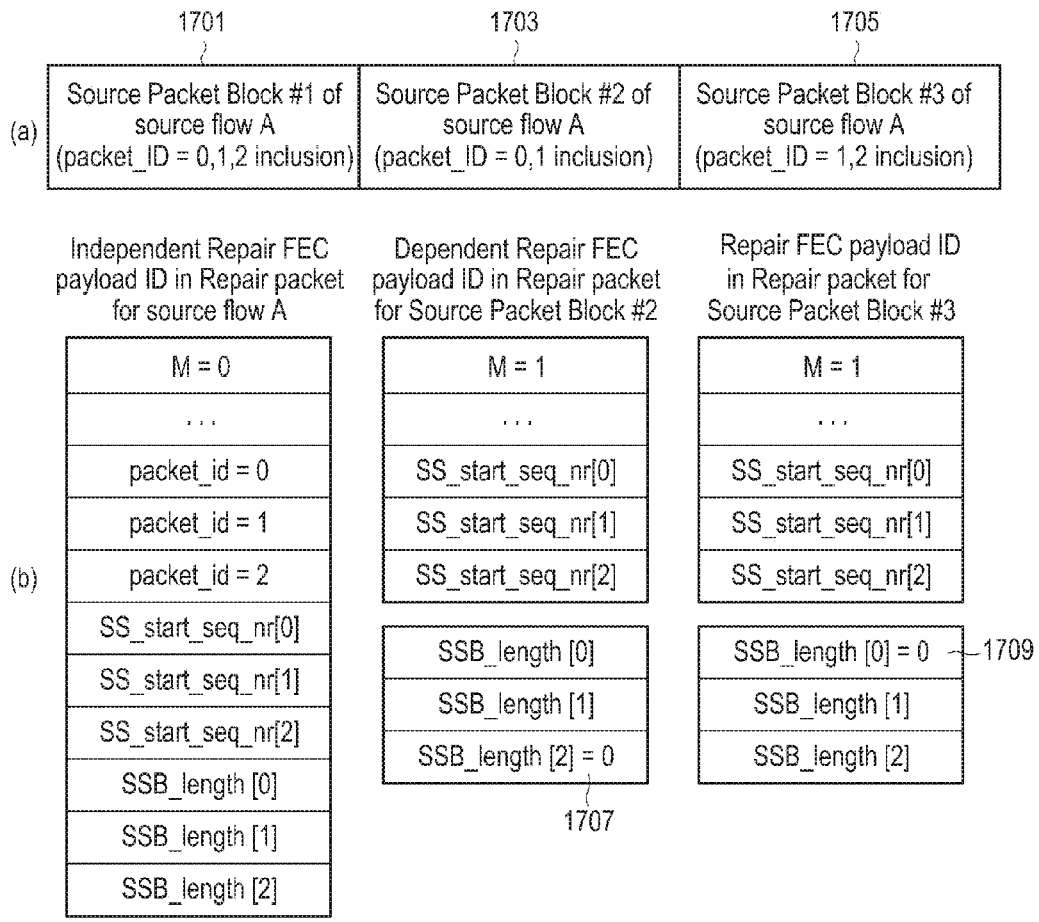
FIG. 17b is a view illustrating a method for setting fields of a repair FEC payload of a repair packet for a packet_ID included in a source flow but excluded from some source packet block according to another embodiment of the present disclosure.

FIG. 17a is a view illustrating a relation between an independent repair FEC payload ID and dependent repair FEC payload ID according to another embodiment of the present disclosure, and FIG. 17b is a view illustrating a method for setting fields of a repair FEC payload of a repair packet for a packet_ID included in a source flow but excluded from some source packet block according to another embodiment of the present disclosure.

First, as shown in FIG. 17a, the number of SS_start_seq_nr fields and SSB_length fields are specified for all repair packets of the repair flow for the source flow based on the order and number of the Packet_ID's for the source flow specified in the Independent repair FEC payload ID. Even in case the number of Packet_ID's included in the Source Flow is smaller than the number of Packet_ID's included in the source packet (or symbol) block, as shown in FIG. 17b, the repair FEC payload ID of the repair packet for the source packet (or symbol) block has SS_start_seq_nr field's and SSB_length field's as many as the number of Packet_ID's included in the Source flow described in the independent FEC payload ID. However, a particular value is set as SS_start_seq_nr field or SSB_length field corresponding to the order of Packet_IDs not included in the source packet (or symbol) block, thereby indicating that the related source packet (or symbol) block does not include the Packet_ID. As an example, the SSB_length field value may be set to 0 to indicate that the packet having the Packet_ID is not included in the source packet (or symbol) block.

Specifically, referring to FIG. 17b(a), in case whereas the source flow described in the AL-FEC message consists of three Packet_ID's (0, 1, 2), source packet (or symbol) Block #1 consists of 0, 1, and 2 (1701), source packet (or symbol) block #2 of 0 and 1 (1703), and source packet (or symbol) block #3 of 1 and 2 (1705), as shown in FIG. 17b(b), the repair FEC payload ID of the repair packet for the source flow includes three SS_start_seq_nr's and three SSB_length fields as in the order of the Packet_ID's 0, 1, and 2, but in its field value, the repair FEC payload ID of the repair packet for source packet (or symbol) block 1 sets SS_start_seq_nr and SSB_length for packet_ID 0, 1, and 2, the repair FEC payload ID of the repair packet for source packet (or symbol) block 2 sets SS_start_seq_nr and SSB_length for the packet_ID 0 and 1, and does not include packet_ID 2, and thus, sets 0 (1707, 1709) in SSB_length Field to indicate that the source packet (or symbol) block 2 does not include packet_ID 2. Further, since the source packet (or symbol) block 3 does not include Packet_ID 0, the repair FEC payload ID of the repair packet for source packet (or symbol) block 3 sets 0 to the SSB_length Field and SS_start_seq_nr and SSB_length for Packet_ID's 1 and 2. Further, in the SSB_length field corresponding to the Packet_ID not included in the source packet (or symbol) block, the L field to determine the size is set to 0, minimizing the size of SSB_length field. Meanwhile, the method for generating the source packet flow according to another embodiment of the present disclosure is the same as that described above in connection with FIG. 6a.

In other words, when there are three Assets A, B, and C (e.g. non-timed data or timed data such as Audio data, Video data, txt, File, each Asset is separated into predetermined sizes of data, and is then added with MMT Payload Header, and MMT Packet Header to configure MMT Packet Flow (Source Packet Flow). Each of Assets A, B, and C is splitted into five data payloads and each adds the header including the Packet_ID and Packet Sequence Number. Assignment is made as follows: Packet_ID=0 for identifying the packets of Asset A, Packet_ID=1 for Asset B, and Packet_ID=2 for Asset C, and such assignment is made so that the Packet Sequence Number based on each Packet_ID increases by one. An example of the header is the MMT packet header.

Figure 13A:
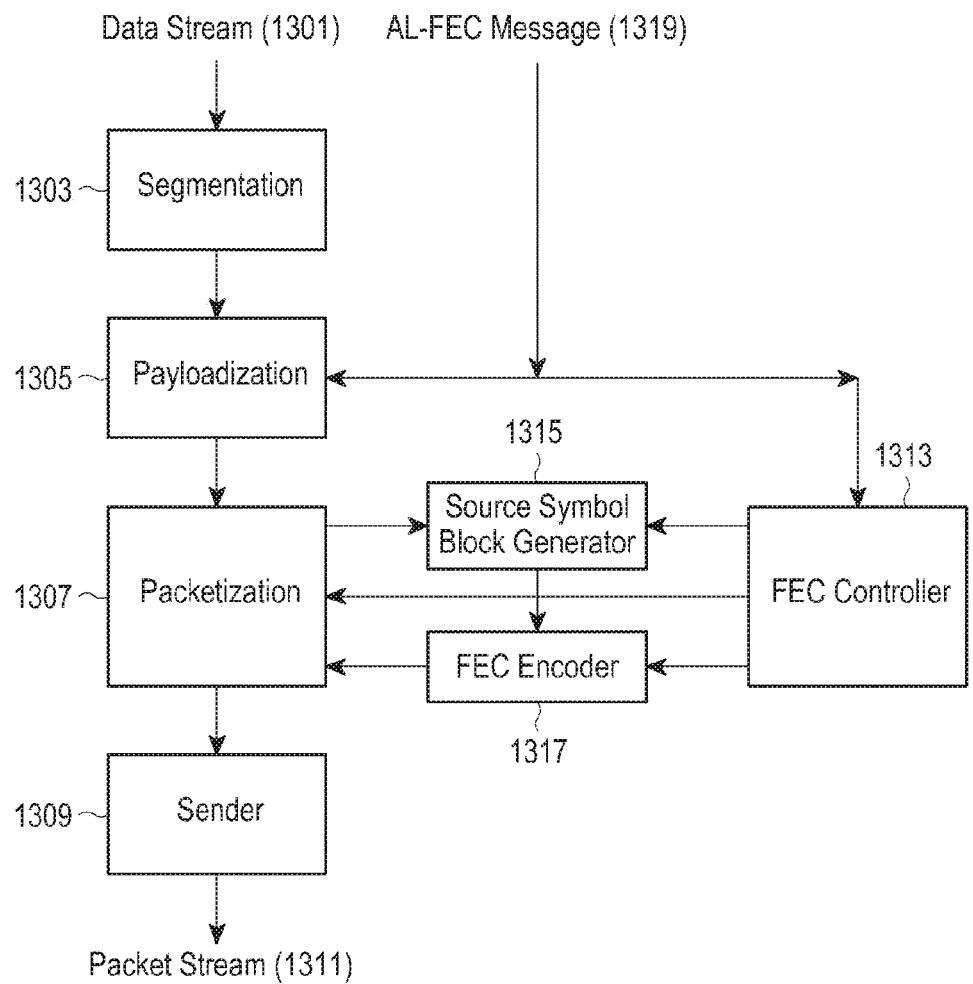
FIG. 13a is a view illustrating an operation of a transmitter for packet protection according to another embodiment of the present disclosure.
Figure 13B:
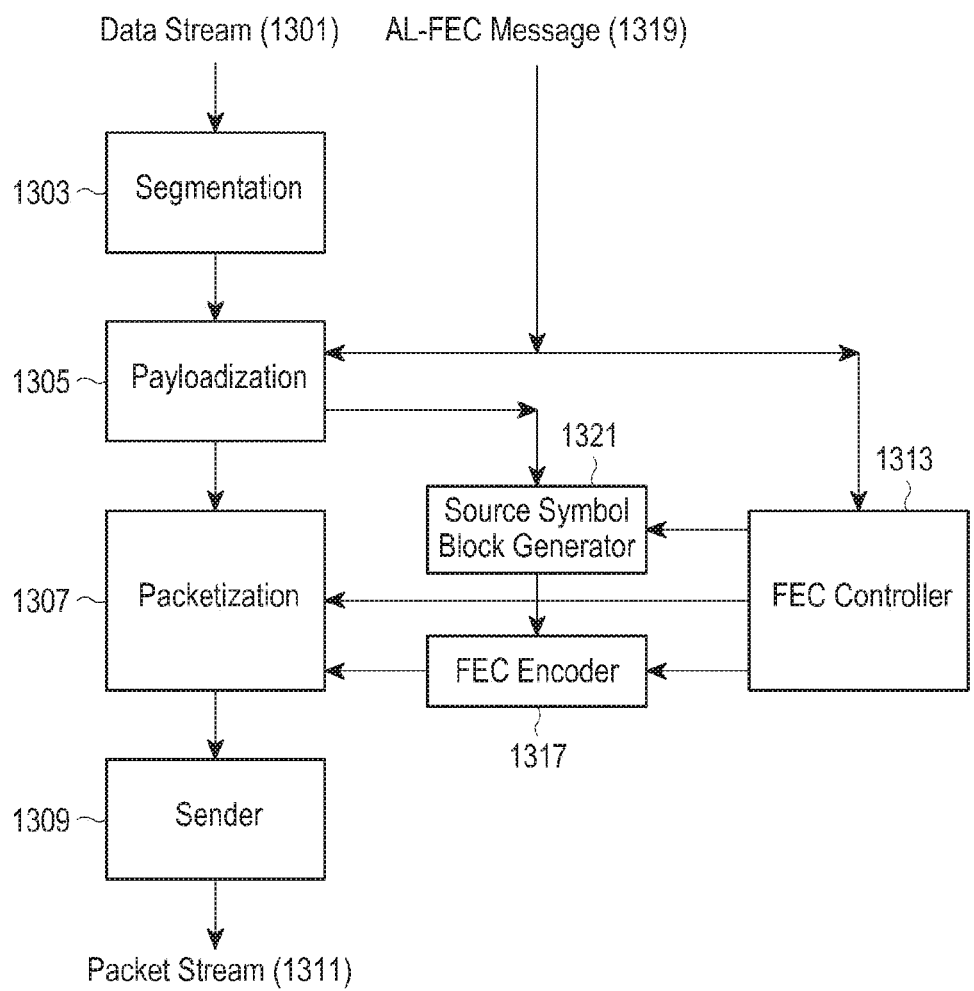
FIG. 13b is a view illustrating an operation of a transmitter for payload protection according to another embodiment of the present disclosure.

FIGS. 13a and 13b are views illustrating the operation of a transmitter for packet protection and payload protection according to an embodiment of the present disclosure. FIG. 13a illustrates the operation of the transmitter for packet protection, and FIG. 13b illustrates the operation for payload protection.

Referring to FIGS. 13a and 13b, first, the Data Stream 1301 is transmitted via Segmentation 1303, Payloadization 1305, and Packetization 1307, to the packet stream 1311 by the transmitting unit 1309. Taking MMT as an example, an arrangement may be made so that Data Stream=Asset. Segmentation splits data into predetermined sizes. Payloadization adds header to the data, and the header stores information capable for reconfiguring the data from the packet received from the receiver. As an example, MMT payload corresponds to this. Packetization 1307 adds MMT packet header to MMT Payload. The MMT Packet Header has Packet_ID and Packet Sequence Number and is thus utilized for FEC.

Further, in case Packet Protection is performed as shown in FIG. 13a, the MMT packets to be FEC protected are inputted to Source Symbol Block Generator 1315 under the control of FEC Controller 1313. Source Symbol Block Generator 1315 generates Source Symbol Block from MMT Packets (Source Packets) (refer to the example of FIG. 10), FEC encoder 1317 receives the Source Symbol Block to generate Repair Symbols, and each Repair Symbol adds MMT Packet Header and FEC Repair Payload ID and it is transmitted in FEC Repair Packet. As set forth above, according to another embodiment of the present disclosure, repair FEC payload ID may be configured as shown in FIG. 12.

Further, as shown in FIG. 13b, in case Payload protection is performed, it is the same as the Packet Protection operation described in connection with FIG. 13a except that MMT Payload or Payload data is inputted to Source Symbol Block Generator 1321.

In case the method according to the present disclosure and the conventional method both use the AL-FEC application scheme, the conventional method requires the AL-FEC message 1319 for AL-FEC decoding of the AL-FEC-applied packets, and in this case, the AL-FEC message 1319 adds the MMT payload header by way of Payloadization 1305 and then adds MMT packet header and this is transmitted in a separate packet different the data. However, in case AL-FEC applies to only the method according to the present disclosure to perform transmission, the AL-FEC message 1319 need not be transmitted in a separate packet. This is why the information required for FEC operation of the receiver according to the present disclosure is transmitted in the repair packet.

Figure 14A:
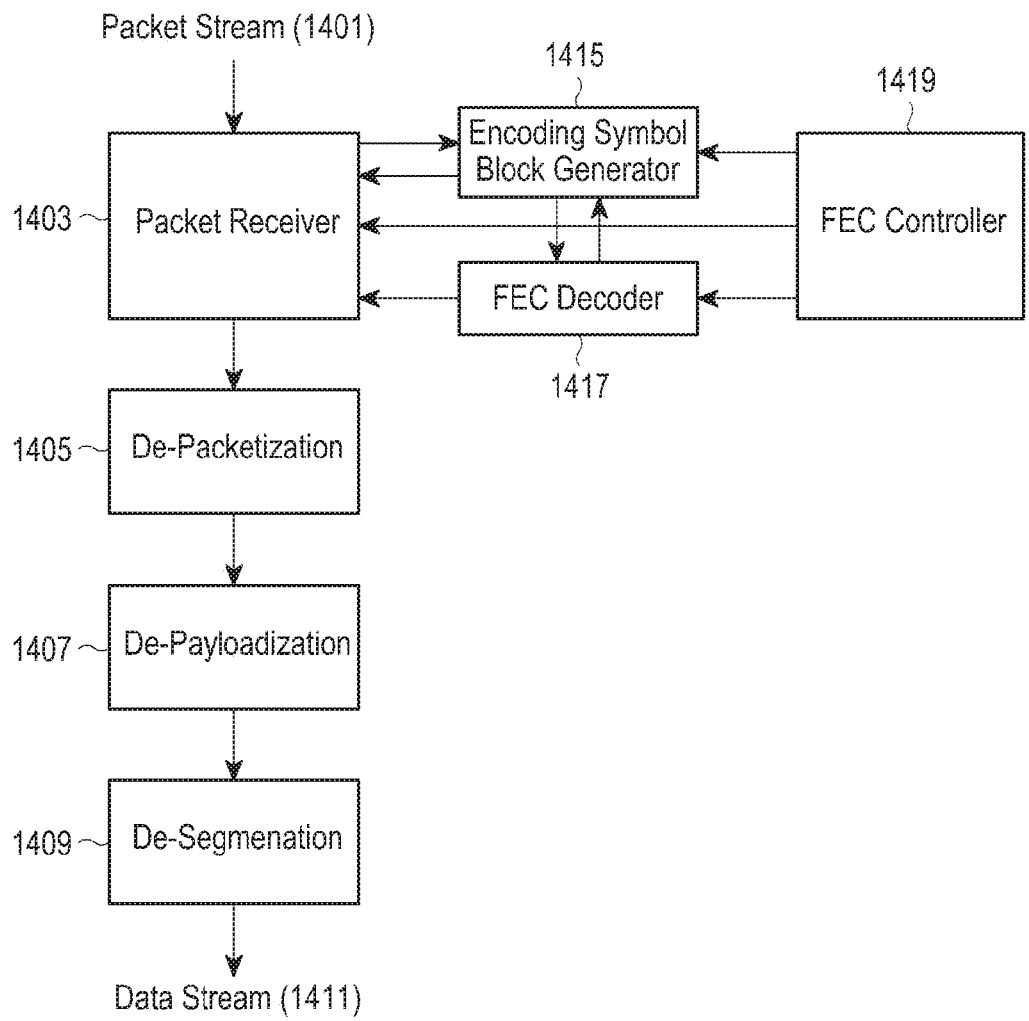
FIG. 14a is a view illustrating an operation of a receiver for packet protection according to another embodiment of the present disclosure.
Figure 14B:
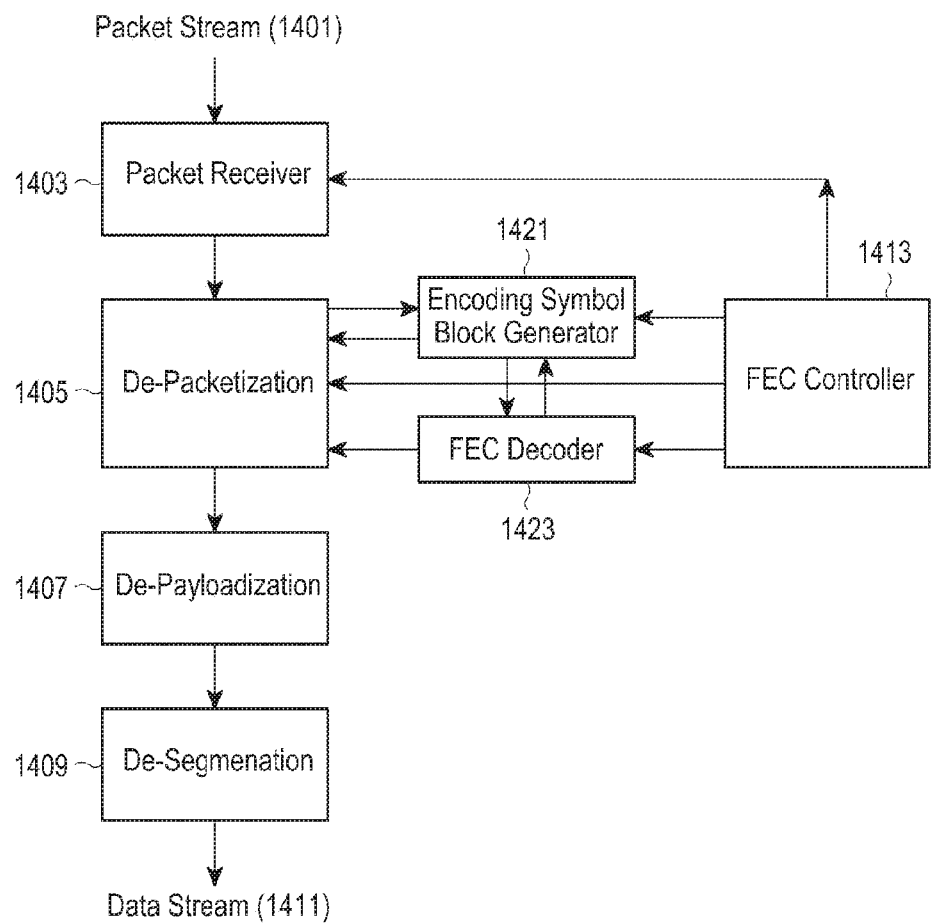
FIG. 14b is a view illustrating an operation of a receiver for payload protection according to another embodiment of the present disclosure.

FIGS. 14a and 14b are views illustrating the operation of a receiver for packet protection and payload protection. FIG. 14a illustrates the operation of the receiver for packet protection, and FIG. 14b illustrates the operation of the receiver for payload protection.

Referring to FIGS. 14a and 14b, the receiver, if receiving the Packet Stream 1401 through the Packet receiving unit 1403, differentiates whether the received packet is the source packet or FEC repair packet. In case several types of source packets (e.g., in case MMP packets (conventional art) having a separate SS_ID and MMP packets with no such IDs (present disclosure) coexist) and several types of FEC repair packets (e.g., in case FEC repair packets according to the conventional art and FEC repair packets according to the present disclosure coexist) coexist, information to differentiate the information is present in the MMT packet header, and the receiver differentiates the packets based on the information. The differentiated packets are restored into the data stream 1411 while passing De-packetization (e.g., MMT De-packetization or Parse) 1405, De-payloadization (MMT Payload Depayloadization or Parse) 1407, and De-segmentation 1409.

As an operation in case the packet protection as shown in FIG. 14a is applied, the receiver differentiates whether the received packet is the source packet or repair packet, and in case the received packet is the repair packet, if the M field of the repair FEC payload ID of the repair packet indicates the independent repair FEC payload ID, recognizes the source packets protected by the repair packet from other information than number (or respective numbers) of Packet_ID's (# of Packet_IDs), List of Packet_IDs, List of SS_Start_Seq_Nrs, List of SSB_Length[ ] listed in the FEC repair payload ID and Packet_ID in the MMT packet header and the repair symbols of the repair packet are recognized, and the received Source Packet (MMT Packet) is inputted to Encoding Symbol Generator 1415 under the control of FEC Controller 1419. Encoding Symbol Generator converts the source packet into source symbol according to the SSBG mode given from the Source Packet, and it together with the repair symbols constitutes Encoding Symbol Block. FEC Decoder 1417 restores the lost source symbol using the repair symbols to obtain the source packet, and the source packet is transferred to the De-packetization block 1405.

Further, in case payload protection is applied as shown in FIG. 14b, the same operation in light of information utilization of MMT Packet Header and utilization of FEC Repair Payload ID information of FEC repair packet as the packet protection operation of FIG. 14a applies except that not packet but payload is restored by Encoding Symbol Generator 1421 and FEC Decoder 1423.

Figure 15:
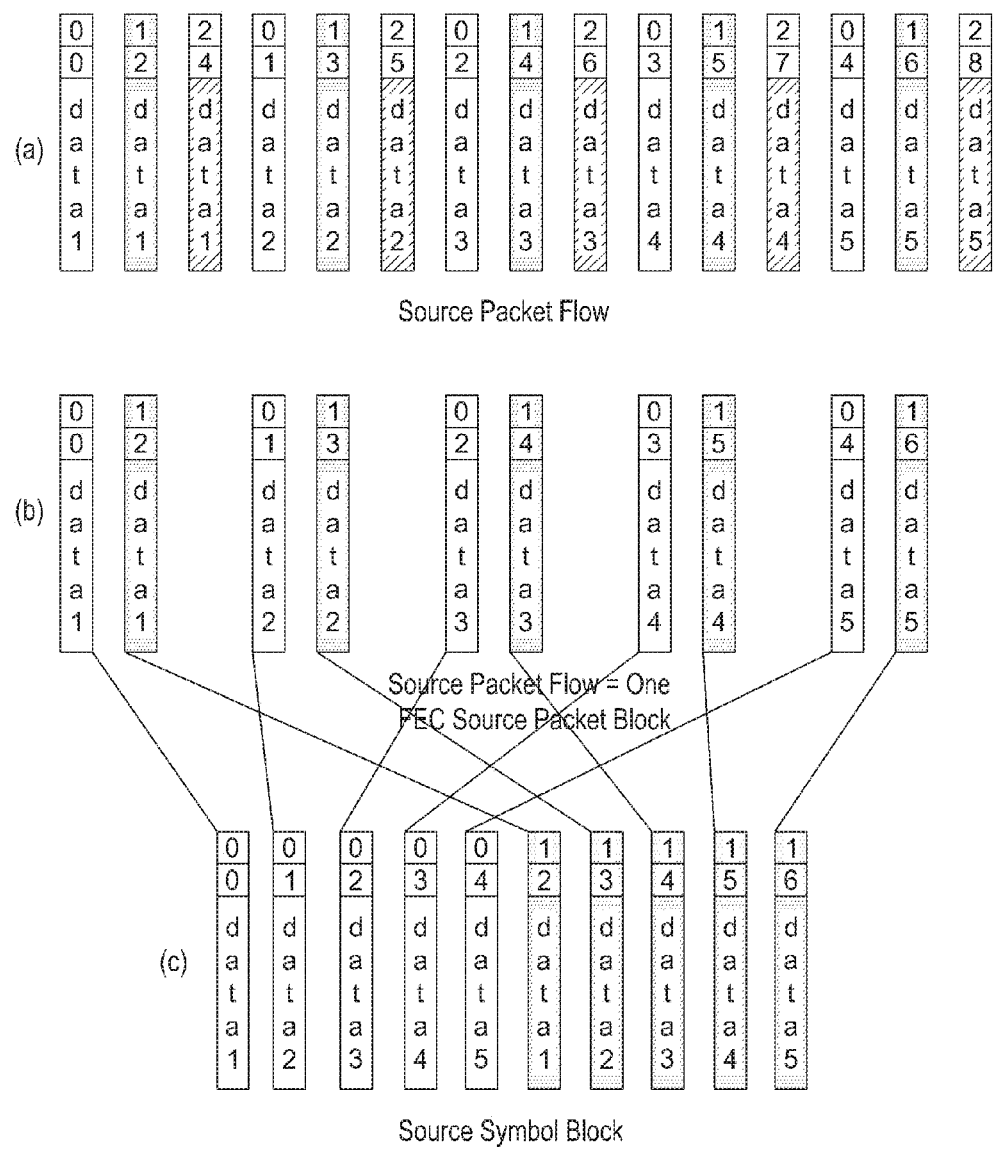
FIG. 15 is a flowchart illustrating an operation configuring a source symbol block according to another embodiment of the present disclosure.

FIG. 15 is a view illustrating an example of generating a source packet block (or source symbol block) according to an embodiment of the present disclosure.

Referring to FIG. 15, from the flow of packets consisting of three Packet_ID's (FIG. 15(a)), packets corresponding to two Packet_ID's having packet_ID=0 or 1 are selected to configure FEC Source Packet Flow (=1 Source Packet Block) (FIG. 15(b)), and the packets having PacketID=0 are first arranged, and then, packets having Packet_ID=1 are arranged to generate the source symbol block (FIG. 9(c)). If the source packets have different lengths upon conversion from Source Packet to Source Symbol, padding is needed (SSBG_MODE1), and if they are of the same length, padding is not required (SSBG_MODE0).

Figure 16:
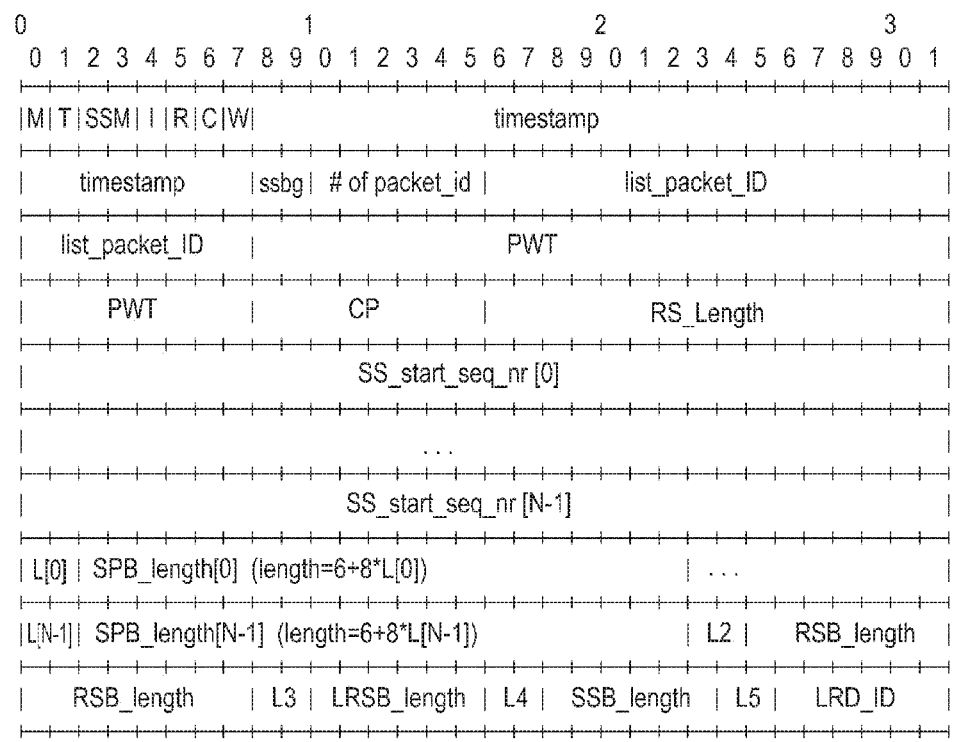
FIG. 16 is a view illustrating a repair FEC payload ID according to another embodiment of the present disclosure.

FIG. 16 is a view illustrating a repair FEC payload ID according to another embodiment of the present disclosure. The details of each information shown in FIG. 16 are shown in Tables 11 to 13 below.

TABLE 11

| information | Detail |
| --- | --- |
| M (1 bit) | indicates whether this repair packet carries dependent repair FEC payload ID or independent repair FEC payload ID. When set to 1, it shall indicate that this packet carries a dependent repair FEC payload ID and when set to 0, it shall indicate that this packet carries an independent repair FEC payload ID. |
| T (1 bit) | indicates whether timestamp field present or not. When set to 0, timestamp field shall not be present and when set to 1, timestamp field shall present. |
| SSM (2 bits) | indicates the size of the SS_start_seq_nr[i] field. The actual size of the SS_start_seq_nr[i] field is allocated to "8+8*SSM" bits. |
| I (1 bit) | defines whether length repair data presents in this FEC repair packet or not. If set to 1, length repair data shall be present. Otherwise, length repair data shall not be present. |
| C (1 bit) | indicates whether Code Point field present or not. When set to 0, Code Point field shall not be present and pre-determined Code Point is used. When set to 1, Code Point field shall be present. |
| W (1 bit) | indicates whether Protection Window Time field present or not. When set to 0, Protection Window Time field shall not be present. When set to 1, Protection Window Time field shall be present. |
| timestamp (32 bits) | indicates the timestamp of the first packet of source packet block which is protected by this repair packet. |
| ssbg_mode (2bits) | indicates the applied source symbol block generation mode to the source packet block which is protected by this repair packet. The same value shall be set to this field of all repair packets for a repair flow. |

TABLE 12

| information | Detail |
| --- | --- |
| # of packet_id (6 bits) | indicates the number of packet_ids which consists of a source flow to be protected. If whole MMT flow is protected, this field shall be set to 0. The same value shall be set to this field of all repair packets for a repair flow. |
| list_packet_id (Num*16 bits) | provides list of packet_ID to be protected by a repair flow for this packet. When # of packet_id set to 0, then this field shall not present, otherwise Num = # of packet_id. The same value shall be set to this field of all repair packets for a repair flow. |
| CP (8 bits) | indicates the Code Point which is used to generate the repair flow. This field shall only present when C set to 1. The same value shall be set to this field of all repair packets for a repair flow. |
| PWT (32 bits) | indicates Protection Window Time of FEC source or repair packet block which is relevant to this repair packet. This field shall only present when W set to 1. The same value shall be set to this field of all repair packets for a repair flow. |
| RS_length (16 bits) | indicates the length (in bytes) of repair symbol. The same value shall be set to this field of all repair packets for a repair flow. |
| SS_start_seq_nr[i] (8+8*SSM bits) | If PM set to 0, it indicates LSB part (8+8*SSM bits) of the lowest packet_count of a packet in the source symbol block which is protected by this repair packet. Otherwise, it indicates LSB part (8+8*SSM bits) of the lowest packet_sequence_number of a packet with the ith packet_ID of list_packet_ID field in the source symbol block which is protected by this repair packet (i=0, 1,,Num-1). |
| L[i] (2 bits) | provides the number of additional words in the SSB_length[i] field. |

TABLE 13

| information | Detail |
| --- | --- |
| SPB_length[i] (6+8*L[i] bits) | indicates the number of packets with ith packet_ID of list_packet_ID field of the source symbol block which is protected by this repair packet. |
| L2 (2 bits) | provides the number of additional words in the RSB_length field. |
| RSB_length (6+8*L2 bits) | the number of repair symbols in its associated repair symbol block. |
| L3 (2 bits) | provides the number of additional words in the LRSB_length field. |
| LRSB_length (6+8*L3 bits) | indicates the number of length repair data in its associated length repair data block. This field only presents when length repair data presents in this FEC repair packet. i.e I is set to 1 |
| L4 (2 bits) | provides the number of additional words in the SSB_length field. |
| SSB_length (6+8*L4 bits) | indicates the number of source symbols in the source symbol block. This field only presents when SSBG Mode 2 is applied. |
| L5 (2 bits) | provides the number of additional words in the LRD_ID field. |
| LRD_ID (6+8*L5 bits) | an integer number for identifying the first length repair data in the FEC repair packet. It starts with 0 and is incremented by 1 with each length repair data in its associated length repair data block. It only presents when length repair data presents in the FEC repair packet. i.e I is set to 1. |

Note,
1) The order of the fields in the repair FEC payload ID determines the order in which source symbols are concatenated in the source symbol block.
2) For a given source flow, the order of the SS_start_seq_nr[i], L[i], and SSB_length[i] fields are determined by the order of packet_ids in the independent repair FEC payload ID of a repair FEC packet for the source flow.
3) If the field M indicates that this repair packet carries dependent repair FEC payload ID, then C and W fields are reserved.
4) If the field M indicates that this repair packet carries dependent repair FEC payload ID, then ssbg_mode, # of packet_id, list_packet_id, CP, PWT and RS_length fields shall not be present.

FIGS. 18 and 19 are views illustrating repair packet blocks for transmitting repair symbols generated by applying FEC to source packet block according to an embodiment of the present disclosure. The independent repair FEC payload ID is transmitted in the first, third, and fifth repair packets, and the dependent repair FEC payload ID is transmitted in the second and fourth repair packets. The receiver may be aware of the order and list of the Packet_ID's included in the corresponding source flow from the independent repair FEC payload ID and may also obtain the FEC configuration information required for FEC operation. Although not shown, the dependent repair FEC payload ID may include only the location information in the repair symbol block of the repair symbol present in the repair packet received along with the repair FEC payload ID information specified in w13982, or in the MMTP packet header, it may be replaced using the packet sequence number field. In this case, the dependent repair FEC payload ID is not present as shown in FIG. 19.

According to an embodiment of the present disclosure, higher-quality services may be offered to the user. According to the present disclosure, the receiving device may differentiate each data stream from separate control information different from the source packet or stream differentiating information in the FEC packet, grasp the repair stream generated for FEC protection on each data stream, smoothly perform FEC decoding, and generate a repair flow for a predetermined number of data streams included in the generated source packet flow without influencing the source packet.

Although specific embodiments of the present disclosure have been described above, various changes may be made thereto without departing from the scope of the present disclosure. Thus, the scope of the present disclosure should not be limited to the above-described embodiments, and should rather be defined by the following claims and equivalents thereof.

The invention claimed is:

1. A method for transmitting a packet in a communication system, the method comprising:
generating, by a sending entity, the packet including at least one repair symbol, wherein the at least one repair symbol is included in a repair symbol block which is generated from a source symbol block by forward error correction (FEC) encoding, and wherein the source symbol block is generated based on a mode among a plurality modes for generating the source symbol block from a source packet block; and
transmitting, by the sending entity, the packet and a message which includes information indicating the mode,
wherein, in a first mode of the plurality of modes, a padding is added to a source packet in the source packet block, and in a second mode of the plurality of modes, no padding is added to source packets in the source packet block.

2. The method of claim 1, wherein the packet includes information indicating a number of repair symbols included in the repair symbol block, and information including sequence numbers of the at least one repair symbol.

3. The method of claim 1, wherein the packet includes information indicating a number of source symbols included in the source symbol block, and information indicating a sequence number of a first source symbol of the source symbols.

4. The method of claim 1, wherein the packet includes information indicating a timestamp of the packet.

5. The method of claim 1, wherein the packet includes information indicating a type of the packet which indicates whether the packet is a packet without FEC protection or a packet with the FEC protection or a packet for at least one repair symbol.

6. The method of claim 5, wherein a value of the information indicating the type of the packet being '0' indicates the packet is the packet without the FEC protection, the value of the information indicating the type of the packet being '1' indicates the packet is the packet with the FEC protection, and the value of the information indicating the type of the packet being '2' indicates the packet is the packet for the at least one repair symbol.

7. A device transmitting a packet in a communication system, the transmitting device comprising:
a transceiver; and
a controller coupled to the transceiver, wherein the controller is configured to:
generate the packet including at least one repair symbol, wherein the at least one repair symbol is included in a repair symbol block which is generated from a source symbol block by forward error correction (FEC) encoding, and wherein the source symbol block is generated based on a mode among a plurality of modes for generating the source symbol block from a source packet block, and
transmit, by the transceiver, the packet and a message which includes information indicating the mode,
wherein, in a first mode of the plurality of modes, a padding is added to a source packet in the source packet block, and in a second mode of the plurality of modes, no padding is added to source packets in the source packet block.

8. The device of claim 7, wherein the packet includes information indicating a number of repair symbols included in the repair symbol block, and information including sequence numbers of the at least one repair symbol.

9. The device of claim 7, wherein the packet includes information indicating a number of source symbols included in the source symbol block, and information indicating a sequence number of a first source symbol of the source symbols.

10. The device of claim 7, wherein the packet includes information indicating a timestamp of the packet.

11. The device of claim 7, wherein the packet includes information indicating a type of the packet which indicates whether the packet is a packet without FEC protection or a packet with the FEC protection or a packet for at least one repair symbol.

12. The device of claim 11, wherein a value of the information indicating the type of the packet being '0' indicates the packet is the packet without the FEC protection, the value of the information indicating the type of the packet being '1' indicates the packet is the packet with the FEC protection, and the value of the information indicating the type of the packet being '2' indicates the packet is the packet for the at least one repair symbol.

* * * * *